US008316533B2

(12) United States Patent
Suminto et al.

(10) Patent No.: US 8,316,533 B2
(45) Date of Patent: Nov. 27, 2012

(54) MEDIA-COMPATIBLE ELECTRICALLY ISOLATED PRESSURE SENSOR FOR HIGH TEMPERATURE APPLICATIONS

(75) Inventors: James Tjanmeng Suminto, West Covina, CA (US); Mohammad Yunus, Castro Valley, CA (US)

(73) Assignee: S3C, Inc., Sunnyvale, CA (US)

( * ) Notice: Subject to any disclaimer, the term of this patent is extended or adjusted under 35 U.S.C. 154(b) by 59 days.

(21) Appl. No.: 12/855,528

(22) Filed: Aug. 12, 2010

(65) Prior Publication Data
US 2010/0304518 A1 Dec. 2, 2010

Related U.S. Application Data

(62) Division of application No. 12/397,253, filed on Mar. 3, 2009, now Pat. No. 7,775,119.

(51) Int. Cl.
H05K 3/36 (2006.01)
(52) U.S. Cl. .............. 29/830; 29/25.35; 29/594; 29/852
(58) Field of Classification Search ..................... 29/594, 29/25.35, 830, 852
See application file for complete search history.

(56) References Cited

U.S. PATENT DOCUMENTS

| 3,602,777 | A |   | 8/1971  | Huckert          |
|-----------|---|---|---------|------------------|
| 3,800,264 | A |   | 3/1974  | Kurtz et al.     |
| 3,899,766 | A | * | 8/1975  | Melmelstein ........ 338/42 |
| 4,400,869 | A |   | 8/1983  | Wilner et al.    |
| 4,456,901 | A |   | 6/1984  | Kurtz et al.     |
| 4,523,964 | A |   | 6/1985  | Wilner et al.    |
| 4,994,781 | A |   | 2/1991  | Sahagen          |
| 5,095,401 | A |   | 3/1992  | Zavracky et al.  |
| 5,186,055 | A |   | 2/1993  | Kovacich et al.  |
| 5,207,102 | A |   | 5/1993  | Takahashi et al. |
| 5,333,505 | A |   | 8/1994  | Takahashi et al. |
| 5,351,550 | A |   | 10/1994 | Maurer           |
| 5,412,992 | A |   | 5/1995  | Tobita et al.    |

(Continued)

FOREIGN PATENT DOCUMENTS

DE 10347418 5/2005

(Continued)

OTHER PUBLICATIONS

Office Action in U.S. Appl. No. 11/544,089, dated May 28, 2009.

(Continued)

*Primary Examiner* — Derris Banks
*Assistant Examiner* — Azm Parvez
(74) *Attorney, Agent, or Firm* — Nixon Peabody LLP

(57) ABSTRACT

A method for manufacturing a Micro-Electro-Mechanical System pressure sensor. The method includes forming a gauge wafer including a diaphragm and a pedestal region. The method includes forming an electrical insulation layer disposed on a second surface of the diaphragm region and forming a plurality of sensing elements patterned on the electrical insulation layer disposed on the second surface in the diaphragm region. The method includes forming a cap wafer with a central recess in an inner surface and a plurality of through-wafer embedded vias made of an electrically conductive material in the cap wafer. The method includes creating a sealed cavity by coupling the inner recessed surface of the cap wafer to the gauge wafer, such that electrical connections from the sensing elements come out to an outer surface of the cap wafer through the vias. The method includes attaching a spacer wafer with a central aperture to the pedestal region with the central aperture aligned to the diaphragm region.

28 Claims, 20 Drawing Sheets

U.S. PATENT DOCUMENTS

| | | | |
|---|---|---|---|
| 5,438,875 | A | 8/1995 | Fung et al. |
| 5,591,679 | A | 1/1997 | Jakobsen et al. |
| 5,792,958 | A | 8/1998 | Speldrich |
| 5,929,497 | A | 7/1999 | Chavan et al. |
| 5,994,161 | A | 11/1999 | Bitko et al. |
| 6,109,113 | A | 8/2000 | Chavan et al. |
| 6,272,928 | B1 | 8/2001 | Kurtz |
| 6,311,561 | B1 | 11/2001 | Bang et al. |
| 6,505,811 | B1 | 1/2003 | Barron et al. |
| 6,623,984 | B1 | 9/2003 | Fleischman et al. |
| 6,713,828 | B1 | 3/2004 | Chavan et al. |
| 6,718,830 | B1 | 4/2004 | Johnson |
| 6,732,589 | B2 | 5/2004 | Eickhoff et al. |
| 6,750,478 | B2 | 6/2004 | Yoshida et al. |
| 6,938,490 | B2 | 9/2005 | Wagner et al. |
| 6,945,120 | B1 | 9/2005 | Marcus et al. |
| 6,948,374 | B2 | 9/2005 | Miyashita |
| 7,004,035 | B2 | 2/2006 | Saito et al. |
| 7,105,902 | B2 | 9/2006 | Asami et al. |
| 7,135,749 | B2 | 11/2006 | Sakai et al. |
| 7,181,972 | B2 | 2/2007 | Dasgupta et al. |
| 7,183,620 | B2 | 2/2007 | Kurtz et al. |
| 7,231,828 | B2 | 6/2007 | Kurtz et al. |
| 7,258,018 | B2 | 8/2007 | Kurtz et al. |
| 7,270,009 | B2 | 9/2007 | Miyashita |
| 7,518,234 | B1 | 4/2009 | Okojie |
| 7,775,119 | B1 | 8/2010 | Suminto et al. |
| 2001/0009195 | A1 | 7/2001 | Solanki et al. |
| 2002/0029639 | A1 | 3/2002 | Wagner et al. |
| 2004/0041254 | A1 | 3/2004 | Long et al. |
| 2004/0077117 | A1 | 4/2004 | Ding et al. |
| 2004/0155243 | A1 | 8/2004 | Asami et al. |
| 2005/0035446 | A1 | 2/2005 | Karpman et al. |
| 2005/0056870 | A1 | 3/2005 | Karpman et al. |
| 2005/0093134 | A1 | 5/2005 | Tarn |
| 2005/0100290 | A1 | 5/2005 | Huang |
| 2005/0115811 | A1 | 6/2005 | Receveur et al. |
| 2006/0144153 | A1 | 7/2006 | Brosh |
| 2006/0197215 | A1 | 9/2006 | Potter |
| 2007/0228499 | A1 | 10/2007 | Dangtran et al. |
| 2008/0006092 | A1 | 1/2008 | Brida et al. |
| 2008/0099861 | A1 | 5/2008 | Dangtran |
| 2008/0277747 | A1 | 11/2008 | Ahmad |
| 2008/0308920 | A1 | 12/2008 | Wan |
| 2010/0044809 | A1 | 2/2010 | Dangtran et al. |

FOREIGN PATENT DOCUMENTS

| | | | |
|---|---|---|---|
| DE | 102004045854 | | 4/2006 |
| WO | 8801049 | | 2/1988 |
| WO | 2004074168 | | 9/2004 |
| WO | 2007117447 | | 10/2007 |
| WO | 2008060389 | | 5/2008 |

OTHER PUBLICATIONS

Office Action in U.S. Appl. No. 11/544,089, dated Jan. 22, 2010.
Office Action in U.S. Appl. No. 11/544,089, dated May 12, 2010.
Office Action in U.S. Appl. No. 11/544,089, dated Sep. 27, 2010.
Office Action in U.S. Appl. No. 11/975,618, dated Jun. 25, 2009.
Office Action in U.S. Appl. No. 12/151,771, dated Sep. 30, 2009.
Office Action in U.S. Appl. No. 12/151,771, dated May 26, 2010.
European Office Action in European Application No. 07754751.1, dated Mar. 18, 2010.
International Search Report and Written Opinion in International Application No. PCT/US2010/026024, mailed May 4, 2010.
International Search Report and Written Opinion in International Application No. PCT/US2009/054692, mailed Oct. 9, 2009.
International Search Report and Written Opinion in International Application No. PCT/US2007/022336, mailed Nov. 7, 2008.
International Search Report and Written Opinion in International Application No. PCT/US2007/008278, mailed Nov. 13, 2007.
"SM5102: OEM Silicon Pressure Die," 2001-2002, Silicon Microstructures Incorporated, Milpitas, CA.
"SM5112: Harsh Environment Absolute Silicon Pressure Die," 2003, Silicon Microstructures Incorporated, Milpitas, CA.
Adapt, in Merriam-Webster Online Dictionary, www.merriam-webster.com/dictionary/adapt.
Concentric, in Merriam-Webster Online Dictionary, Retrieved Jun. 18, 2009, from www.merriam-webster.com/dictionary/concentric.
Bauer, "First High Volume Trough Silicon Via Process for MEMS," Silex Microsystems. Presented at the Micromachines 2007 Conference in Tokyo, Japan.
Fairchild et al., "Emerging Substrate Technologies for Harsh-Environment Automotive Electronics Applications," SAE 2002 World Congress, Mar. 4-7, 2002, Detroit, Michigan.
Miniature Silicon-On-Insulator Pressure Transducer for Absolute Pressure Measurement at 260 C, Endevco Corporation, San Juan Capistrano, CA and Meggitt PLC, Dorset, UK, Measurement Endeavors TM, Aug. 2007.
Petrovic et al., "Reliability Test Methods for Media-Compatible Pressure Sensors," IEEE Transactions on Industrial Electronics, vol. 45, No. 6, Dec. 1998, pp. 877-885.

* cited by examiner

Table-1 Automotive Temperature

| LOCATION | TYPICAL CONTINUOUS MAX TEMPERATURE | VIBRATION LEVEL | FLUID EXPOSURE |
|---|---|---|---|
| On Engine On Transmission | 140°C | Up to 10 Grms | Harsh |
| At the Engine (Intake Manifold) | 125°C | Up to 10 Grms | Harsh |
| Underhood Near Engine | 120°C | 3 - 5 Grms | Harsh |
| Underhood Remote Location | 105°C | 3 - 5 Grms | Harsh |
| Exterior | 70°C | 3 - 5 Grms | Harsh |
| Passenger Compartment | 70-80°C | 3 - 5 Grms | Benign |

FIG. 11

MEDIA-COMPATIBLE ELECTRICALLY ISOLATED PRESSURE SENSOR FOR HIGH TEMPERATURE APPLICATIONS

STATEMENT OF RELATED APPLICATION

The present application is a divisional application of co-pending U.S. patent application Ser. No. 12/397,253 filed Mar. 3, 2009, in the name of inventors James Tjanmeng Suminto and Mohammad Yunus entitled, "Media-Compatible Electrically Isolated Pressure Sensor For High Temperature Applications", commonly owned herewith.

TECHNICAL FIELD

The present disclosure relates generally to pressure sensing, and more specifically to pressure sensing in a harsh and/or electrically conducting pressurized medium at high temperature.

BACKGROUND

Diaphragm-based pressure sensors have been used for a variety of applications, where pressure exerted by a pressurized medium deflects a diaphragm, and sensing elements (such as strain gauges) coupled to the diaphragm sense the deflection and provide a signal correlating the deflection of the diaphragm with the amount of pressure.

There are two major types of pressure sensors. The first type is called a gauge pressure sensor, which measures pressure with respect to atmospheric pressure. The second type is called an absolute pressure sensor, which typically measures pressure with respect to a vacuum or zero pressure.

FIGS. 1A and 1B respectively show a conventional gauge pressure sensor 100 and a conventional absolute pressure sensor 110, both by Silicon Microstructures, Inc. of Milpitas, Calif. (pressure sensor models SM5102). Both the pressure sensors 100 and 110 use a silicon micromachined structure (also known as a gauge wafer) with a diaphragm having sensing elements (not shown) on the top or outer surface. The micromachined structure is mounted on a support structure (also known as a spacer). Typical dimensions of the pressure sensors are shown in millimeters. Both the pressure sensors 100 and 110 are top side pressure sensors, i.e., the top or outer side of the diaphragm is accessed by the pressurized medium. The support structure in the gauge pressure sensor 100 has an opening to expose the opposite side (i.e., the bottom side or the inner side) of the diaphragm to atmospheric pressure. On the other hand, the support structure in the absolute pressure sensor 110 has no opening, and defines a vacuum reference cavity underneath the diaphragm. Both the pressure sensors 100 and 110 are not ideal for applications involving harsh pressure media (such as fuel mixtures, acidic solution, and the like), as the sensing elements on the top side of the diaphragm may come in contact with the harsh pressurized medium if a protective coating on the sensing elements is damaged.

The gauge pressure sensor reads pressure with respect to atmospheric pressure. Atmospheric pressure varies over elevation and weather conditions. Thus, an absolute pressure sensor is often preferred where high accuracy is needed. For example, gauge pressure reading can change by 2-3 psi due to variations in atmospheric pressure. Thus, it can contribute to 2% to 3% error in the pressure reading if the full scale is 100 psi. Most new pressure sensor applications below 500 psi require +/−1% accuracy over operational temperature range, pressure range, and over the life of the product. Thus absolute pressure sensing is becoming very important in such applications.

FIG. 2 shows a conventional absolute pressure sensor 200, by Silicon Microstructures, Inc. of Milpitas, Calif. (pressure sensor model SM5112). Pressure sensor 200 uses a silicon gauge wafer with a micromachined diaphragm. A boro-silica glass cap sealed to the gauge wafer creates a reference vacuum cavity on top of the diaphragm. The pressurized medium exerts pressure from the bottom side of the diaphragm. The support structure (spacer) is made of boro-silica glass with a drilled hole in the center to allow the pressurized medium to access the bottom side of the diaphragm. The top side of the diaphragm has strain gauge sensing elements, interconnecting diffused resistors, and electrical interconnect metallizations to bring electrical signals out from the strain gauge sensing elements. This configuration is better for applications involving harsh pressurized media, as the sensing elements are separated from the pressurized medium. However, attaching a boro-silica glass cap wafer to a silicon gauge wafer to create a vacuum cavity is a very expensive process.

Another problem encountered by pressure sensor 200 is failure to withstand high temperature because of electrical leakage in the sensing elements. Pressure sensor 200 uses piezoresistors as sensing elements (configured as a strain gauge). In a typical piezoresistive strain gauge, four piezoresistors are connected in a Wheatstone bridge configuration (see FIG. 4) on top of the diaphragm. When the applied pressure deflects the diaphragm, induced stress in the diaphragm causes the piezoresistors to change their respective resistance values, resulting in an imbalance in the Wheatstone bridge. The imbalanced piezoresistor bridge produces an electrical signal output that is proportional to the applied pressure. In a silicon diaphragm, piezoresistors can be integrated at a low cost by using standard photolithographic processes. As shown in FIG. 3 (only the gauge wafer is shown here), piezoresistors may be defined as diffused wells of opposite-polarity regions embedded in the bulk material of the diaphragm. In the inset of FIG. 3, p-type diffused piezoresistors are created in the n-type bulk silicon diaphragm by photolithographically opening windows in the top insulator layer, and then doping with p-type material (e.g., boron) to achieve a desired sheet resistivity. The piezoresistors create diode-like p-n junctions with the diaphragm substrate, as shown in the equivalent circuit in FIG. 4. At temperatures beyond about 125° C., the p-n junctions behave like leaky diodes with the leakage current increasing exponentially as the temperature rises. As shown in FIG. 4, if the surrounding pressurized medium is electrically conductive, current leaks to the ground through the pressurized medium (represented by the resistor R in the equivalent circuit). The current leakage is substantial at higher temperatures, and causes sensing malfunction and may cause irreversible physical damage. Although not shown in FIG. 3 for the sake of clarity, persons of ordinary skill in the art will now understand that interconnecting diffused resistors (as shown in FIG. 2) coupled to the strain gauge piezoresistors will also contribute to current leakage at high temperature. Moreover, contamination during fabrication processes may cause diode current leakage even at lower temperatures such as room temperature.

In the previously discussed examples, a silicon diaphragm is used with integrated sensing elements. Silicon diaphragms and integrated sensing elements are popular because of ease of manufacturing using batch processing. However, depending on particular applications, in some conventional pressure sensors, the diaphragm and the sensor may be separated. This may be useful from a harsh pressurized media compatibility standpoint, as the diaphragm can be made of a corrosion-resistant material, such as stainless steel, and the sensing element can be made of silicon and can be kept isolated from pressurized medium exposure in a sealed chamber filled with an additional pressure transfer medium. One example of this type of sensor is referred to as an oil-filled sensor, where the pressure transfer medium is oil. This process can be relatively expensive, as the oil filling has to be performed in a vacuum. Errors arise in this approach because there is usually a small amount of residual air in the chamber after sealing. Thermal effects on the oil volume and air bubble also act to increase the error in the pressure reading. For reference, readers are encouraged to read U.S. Pat. No. 6,311,561 to Bang et. al.

In the case of a corrosion-resistant metal diaphragm, strain gauges are usually defined by depositing and patterning thin metal films on the diaphragm. For example, a titanium oxy nitride (TiON) strain gauge layer may be deposited on a silicon dioxide coated stainless steel diaphragm. However, typically, this type of strain gauge has lower gauge factors than micromachined silicon piezoresistive strain gauges, affecting pressure measurement accuracy.

By adopting a hybrid configuration, where a micromachined silicon piezoresistive strain gauge is bonded to an oxide-coated metal diaphragm, one can address the low gauge factor problem. However, the hybrid pressure sensor suffers from a thermal expansion mismatch problem between the sensing elements and the diaphragm. Moreover, the hybrid construction may not be efficient for batch processing. Adding a vacuum sealed cavity on top of the sensing elements can be prohibitively expensive. Even depositing oxide on the stainless-steel diaphragm requires an expensive fine polishing process. The operating temperature is typically limited to 140° C. in the hybrid pressure sensor.

Absolute pressure sensors, where the sensing elements are enclosed in a sealed reference cavity, offer the advantage of protection of sensing elements from harsh pressurized media. However, special design and processing steps are required to bring out electrical connections from the sensing elements to outside the sealed chamber, i.e. packaging of the sensor becomes costly. U.S. Pat. Nos. 5,929,497 and 6,109,113 show one way of bringing out electrical connections from a vacuum cavity. The process is complicated and uses capacitive sensors and poly-silicon connections. Wafers are bonded using an electrostatic bonding technique. The same technique with additional circuits is described in U.S. Pat. No. 6,713,828. These techniques are suited for ambient and sub-atmospheric pressure levels in motor vehicle applications.

Accordingly, a new pressure sensor, that offers a combination of a plurality of desired features, including, but not limited to, high accuracy absolute pressure sensing, wide pressure range, chemical and electrical compatibility with harsh pressurized media, reliable operation at all ranges of temperature including high temperatures, ease of manufacturing and packaging, compact size, and low cost would be desirable.

OVERVIEW

In an aspect, a method for manufacturing a Micro-Electro-Mechanical System pressure sensor. The method includes forming a gauge wafer including a diaphragm and a pedestal region. The method includes forming an electrical insulation layer disposed on a second surface of the diaphragm region and forming a plurality of sensing elements patterned on the electrical insulation layer disposed on the second surface in the diaphragm region. The method includes forming a cap wafer with a central recess in an inner surface and a plurality of through-wafer embedded vias made of an electrically conductive material in the cap wafer. The method includes creating a sealed cavity by coupling the inner recessed surface of the cap wafer to the gauge wafer, such that electrical connections from the sensing elements come out to an outer surface of the cap wafer through the vias. The method includes attaching a spacer wafer with a central aperture to the pedestal region with the central aperture aligned to the diaphragm region.

BRIEF DESCRIPTION OF THE DRAWINGS

The accompanying drawings, which are incorporated into and constitute a part of this specification, illustrate one or more examples of aspects and, together with the description of example aspects, serve to explain the principles and implementations of the aspects.

In the drawings:

FIG. 11 shows in tabular form typical operating conditions for the various aspects of the pressure sensors disclosed herein.

DESCRIPTION OF EXAMPLE ASPECTS

Those of ordinary skill in the art will realize that the following description is illustrative only and is not intended to be in any way limiting. Other aspects will readily suggest themselves to skilled artisans having the benefit of this disclosure. Reference will now be made in detail to implementations of the example aspects as illustrated in the accompanying drawings. The same reference indicators will be used throughout the drawings and the following description to refer to the same or like items.

In accordance with this disclosure, the components and process steps described herein may be implemented using various types of semiconductor manufacturing equipment.

Figure 10:
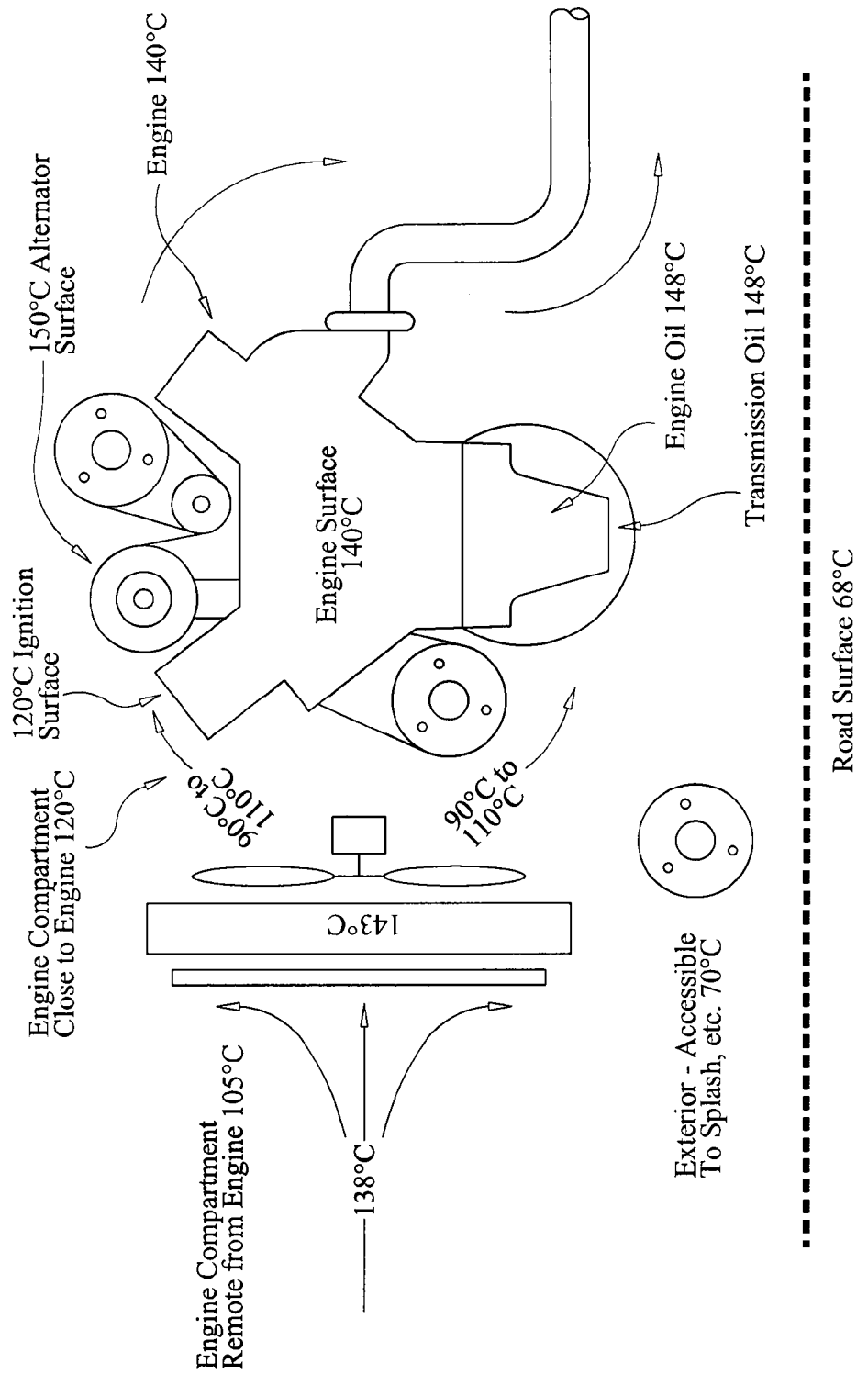
FIG. 10 shows various temperature distribution profiles seen in typical automobiles, where the various aspects of the pressure sensors disclosed herein may be used.

The present disclosure describes pressure sensors that can be used for a wide range of temperature and pressure, including automobile applications, as described with respect to FIGS. 10 and 11. Though absolute pressure sensors are described in detail for illustrative purposes, persons of ordinary skill in the art will appreciate that similar processes may be used to make other type of pressure sensors, such as gauge pressure sensors. In the case of an absolute pressure sensor, a reference cavity may be at actual vacuum or zero pressure, or filled with a chemically compatible fluid (such as gas or liquid) with a known reference pressure, and calibrated to determine the absolute pressure.

Although silicon is often shown as the material of choice for making a micromachined gauge wafer including the diaphragm, and a cap wafer that creates a reference cavity on top of the diaphragm, the scope of the present disclosure is not limited by the choice of material. Similarly, although a spacer as shown can be made of silicon or Pyrex or other types of glasses or ceramic materials, the present disclosure is not intended to be limited by the choice of spacer material.

Persons of ordinary skill in the art will now appreciate that aspects of the present disclosure are likely to have better thermal performance and longevity if the material of the gauge wafer and the material of the sensing elements have similar coefficients of thermal expansion.

Figure 1A:
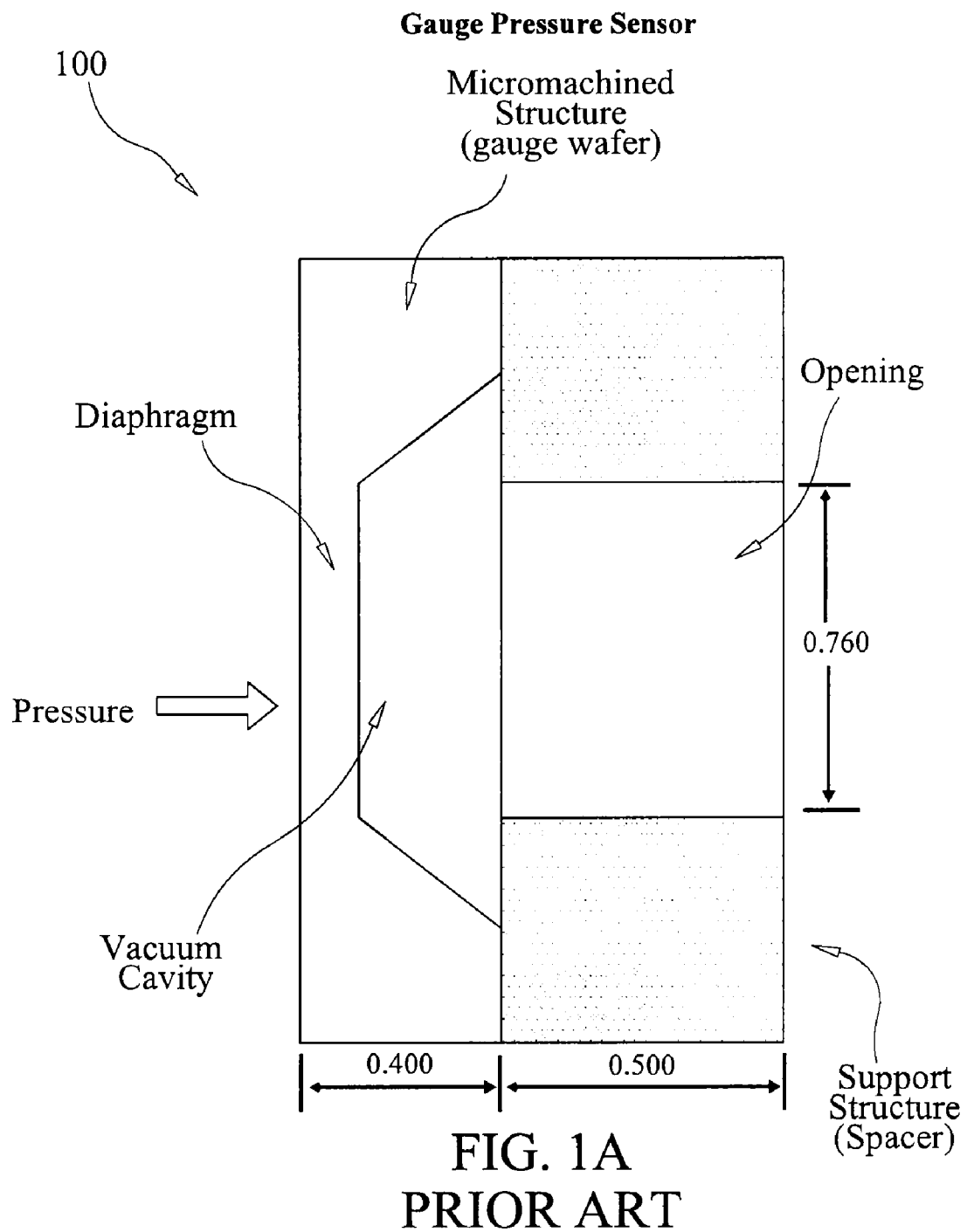
FIGS. 1A-1B show conventional top-side pressure sensors.
Figure 1B:
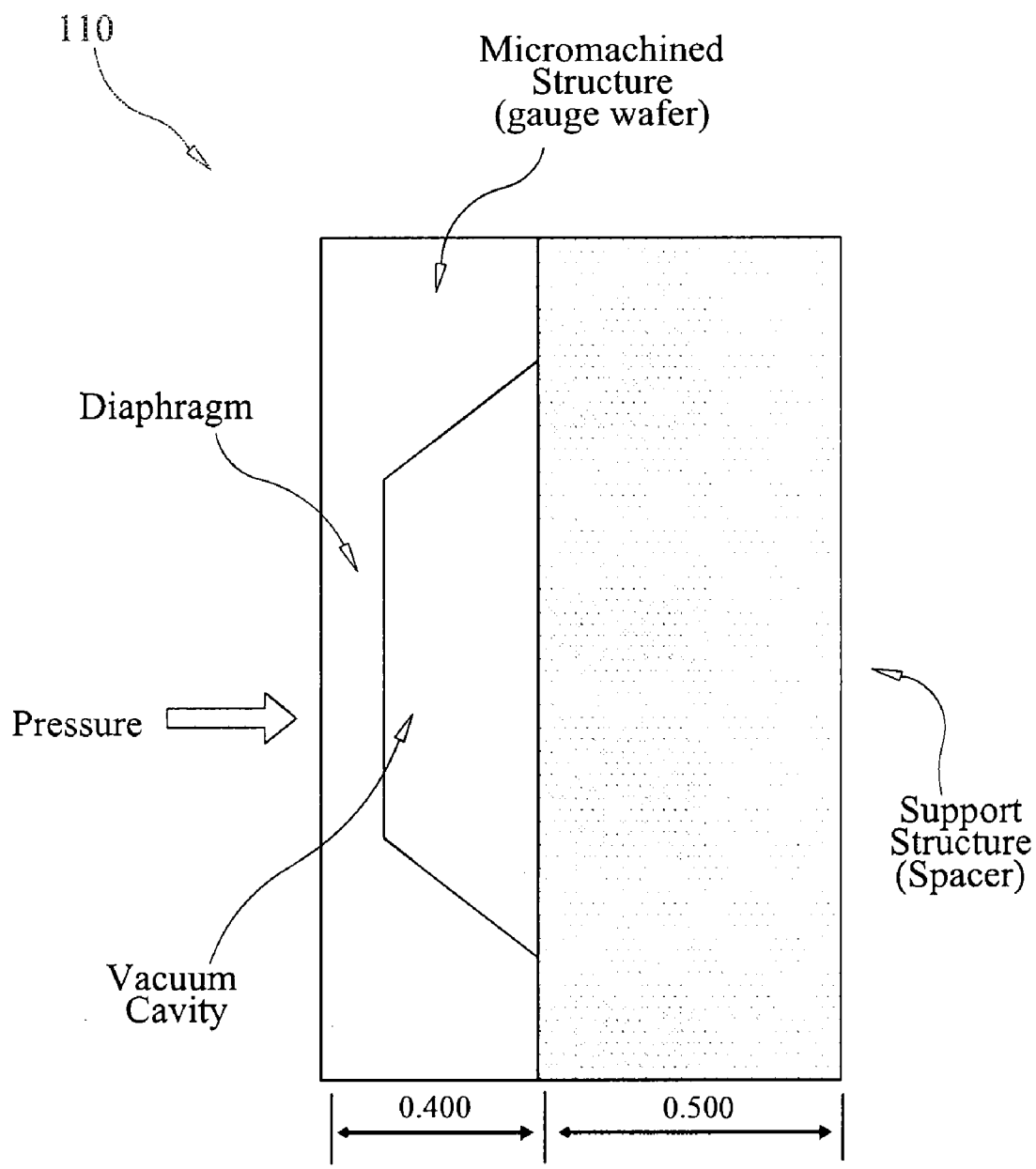
Figure 2:
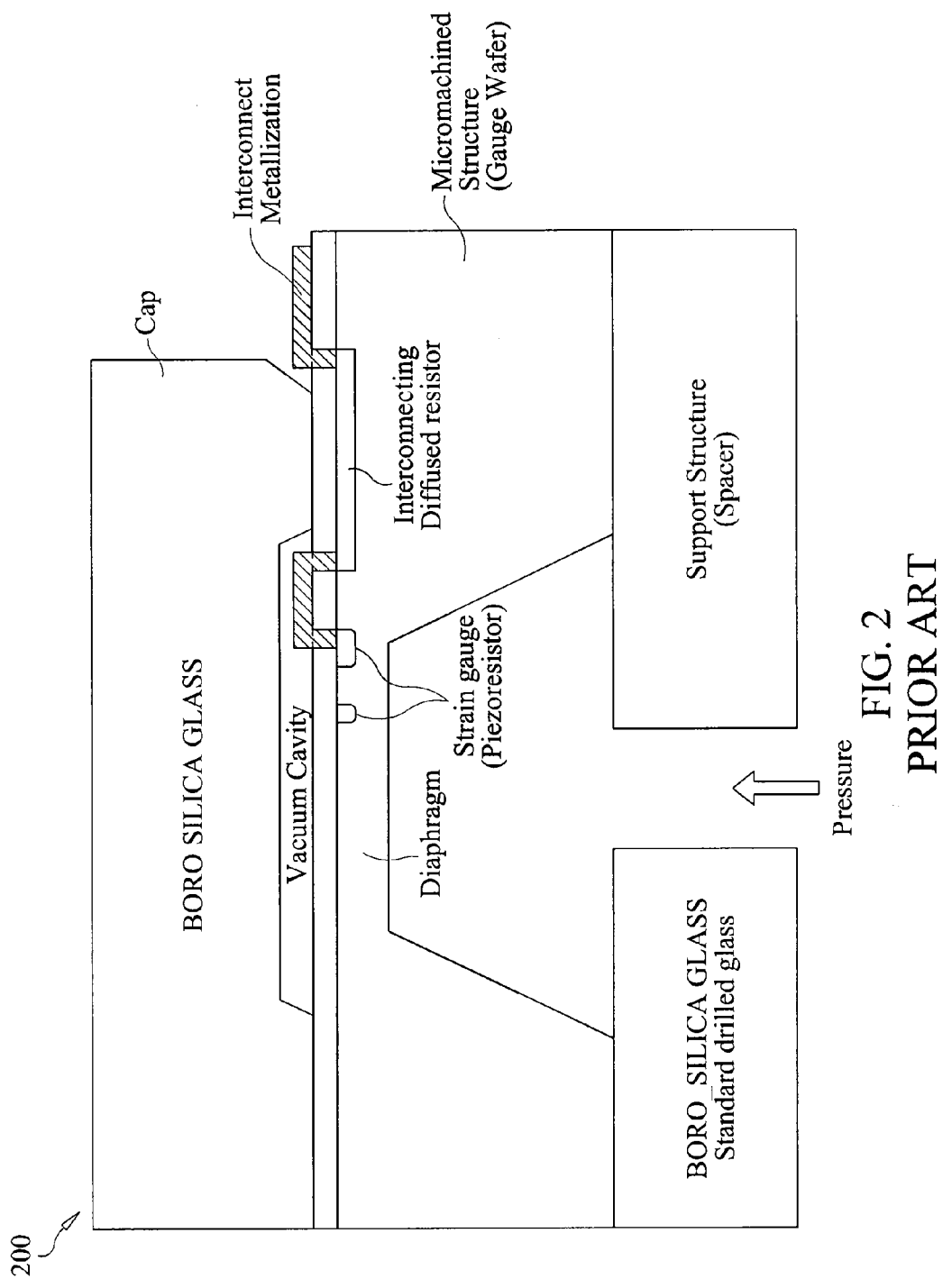
FIG. 2 illustrates an example conventional absolute pressure sensor with sensing elements that are not electrically isolated.
Figure 3:
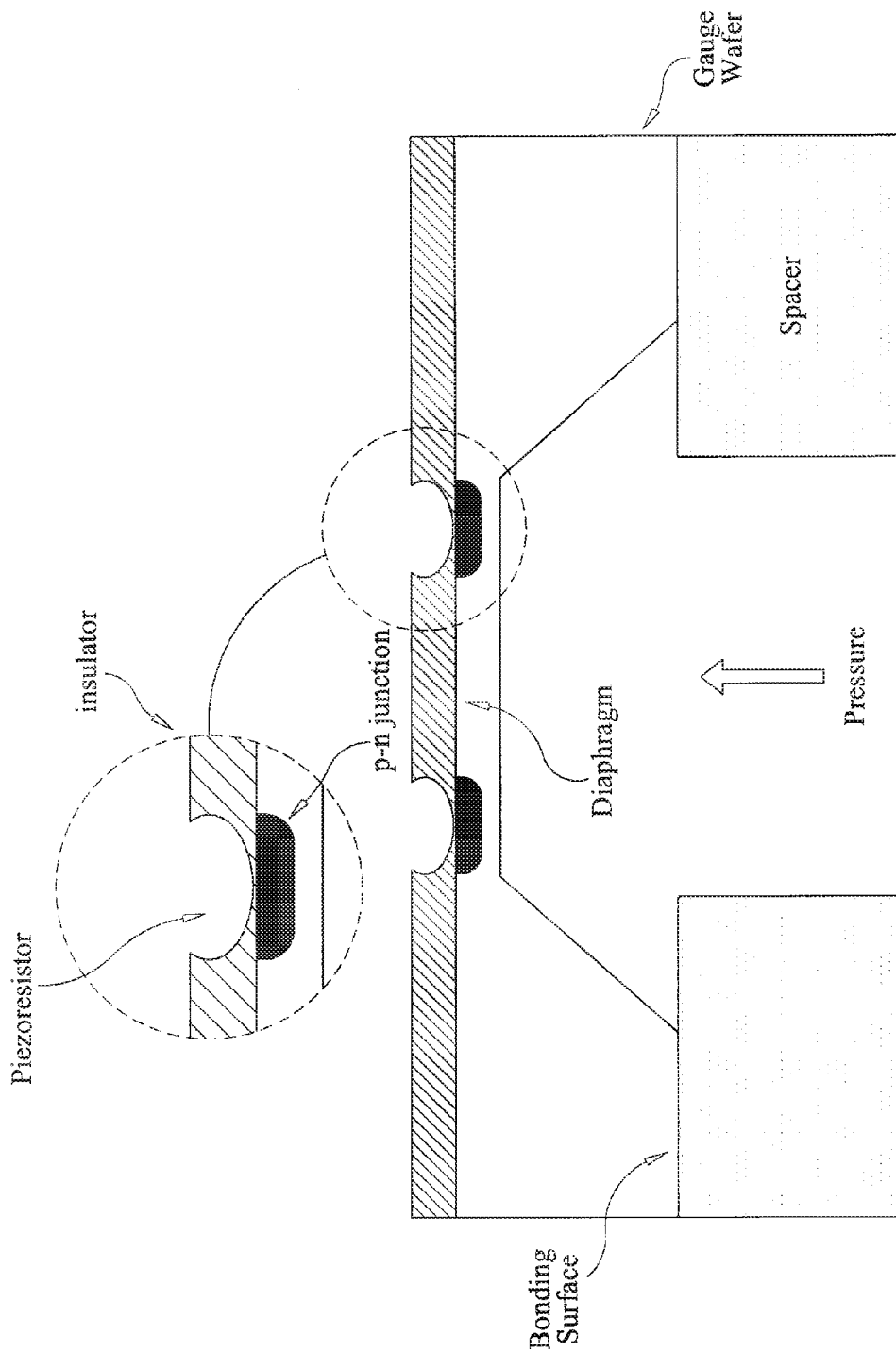
FIG. 3 illustrates details of the non-electrically-isolated sensing elements (piezoresistors) of a conventional micromachined silicon pressure sensor.
Figure 4:
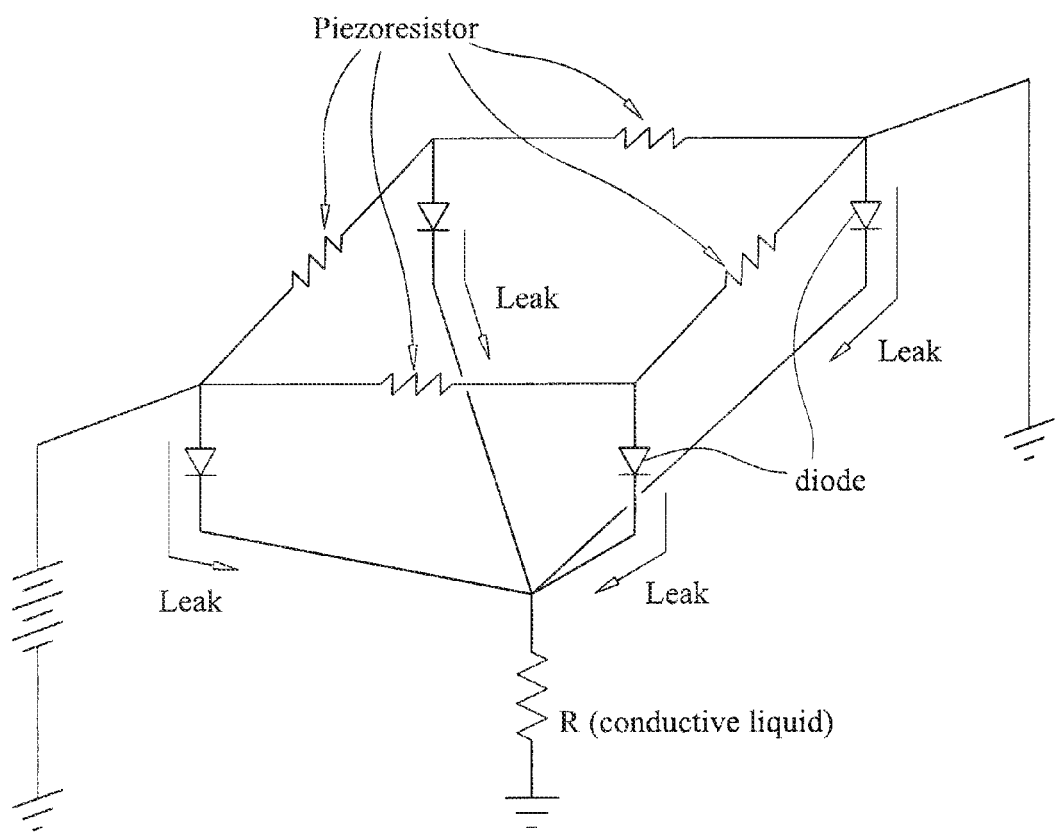
FIG. 4 shows an equivalent electrical circuit demonstrating a current leakage problem encountered by a configuration as shown in FIG. 3.
Figure 5:
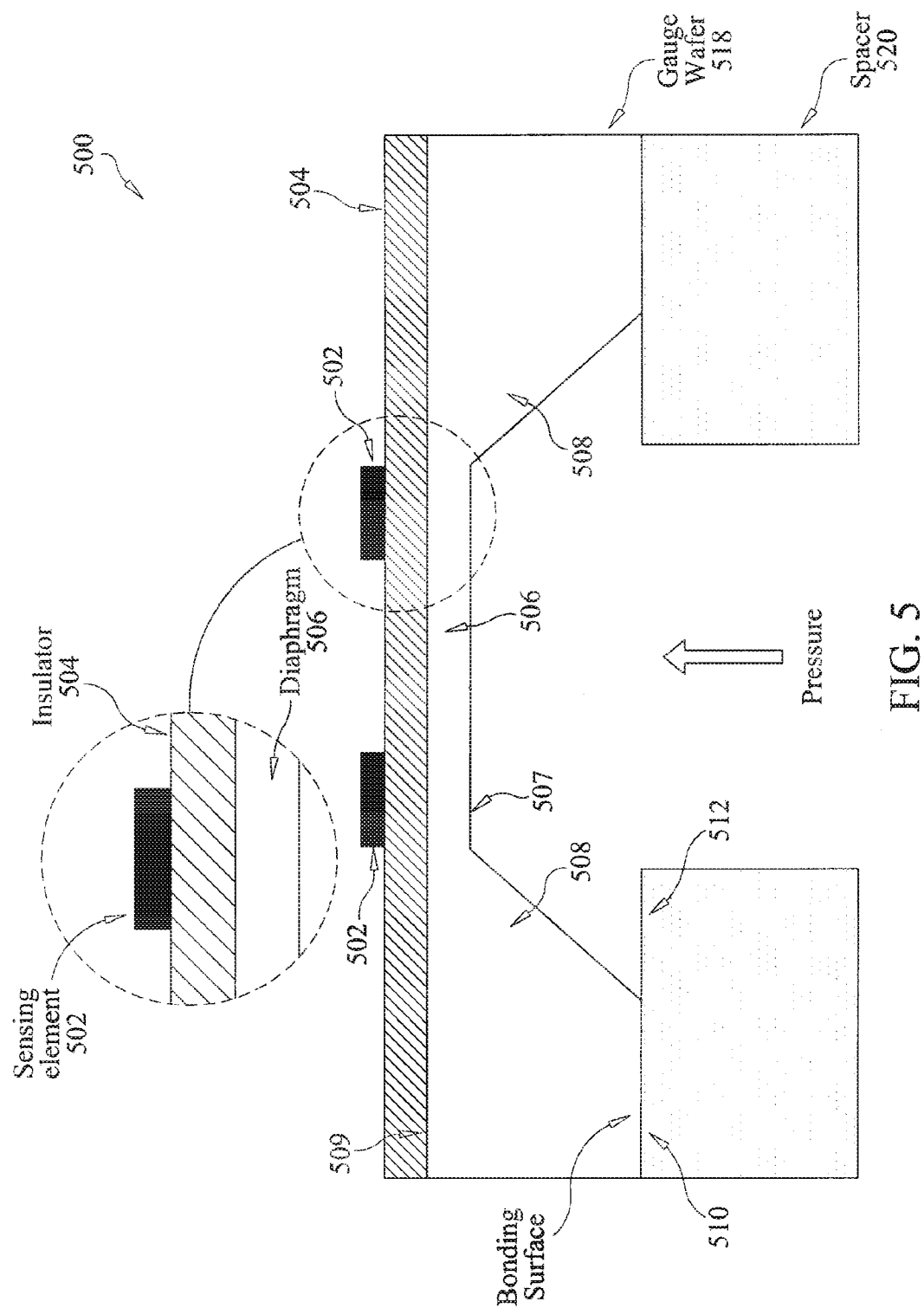
FIG. 5 shows one aspect, wherein sensing elements are electrically isolated from the diaphragm.

FIG. 5 shows a pressure sensor 500, of the present disclosure, wherein sensing elements 502 are electrically and physically isolated from a pressurized medium that exerts pressure from the back side of a diaphragm 506. Gauge wafer 518 may be made of bulk silicon. Diaphragm 506 may be defined by using various micromachining techniques, including, but not limited to anisotropic wet chemical etching, and dry etching (such as Deep Reactive Ion Etching). Micromachining thins down a central portion of gauge wafer 518 to define the diaphragm, while the unetched pedestal portions 508 remain intact, and provide structural support. In one aspect Diaphragm 506 may be about 27 microns thick. However, thickness of the diaphragm will depend upon the range of pressure to be measured. An inner surface 507 of the diaphragm region of the micromachined structure/gauge wafer 518 is accessed by the pressurized medium that deflects the diaphragm 506. A layer of electrically insulating material 504 is deposited or thermally grown on the outer surface 509 of the diaphragm region of the micromachined structure/gauge wafer 518. Insulating material 504 may be silicon dioxide or another suitable insulating material. As no p-n junction is formed in the sensor 500, as shown in detail in the inset, there is no possibility of current leakage at high temperature, as in the case of the conventional pressure sensor shown in FIG. 3. Therefore, this configuration is suitable for high temperature operation (350° C. or even higher), even if the pressurized medium is electrically conductive. The sensor 500 is shown without the reference cavity enclosing the sensing elements 502. However, those of ordinary skill in the art will now be able to modify the structure shown in sensor 500 to create an absolute pressure sensor. Also, for the sake of clarity in this view, interconnections for getting electrical signals out from the sensing elements 502 are not shown.

Sensing elements 502 may be piezoresistors arranged in an electrical configuration to act as a piezoresistive strain gauge. Alternatively, other types of strain gauges may be used without departing from the scope of the disclosure.

Sensing elements 502 may be made of single-crystalline or poly-crystalline silicon or thinned down bulk silicon, or other types of strain gauge material, such as TiON. However, for a silicon gauge wafer 518, silicon sensing elements 502 are the logical choice of material. Poly-crystalline silicon (for the sensing element 502 layer) can be formed on top of the thermally grown silicon dioxide layer 504 by using a low pressure chemical vapor deposition (LPCVD) process. Typically, single crystal silicon has a higher gauge factor compared to poly-silicon. The gauge factor of poly-silicon depends on its grain size. To make a silicon-on-insulator (SOI) gauge wafer, single-crystal silicon film can be formed either by the separation by Implantation of oxygen (SIMOX) process or by fusion bonding. In the SIMOX process, oxygen ions are implanted through a thin layer of silicon, and then heat treated to convert to silicon dioxide with a thin film of single crystal silicon on top. The silicon-on-oxide (SOI) can also be formed by bonding a sacrificial silicon wafer to another oxide coated silicon wafer using fusion bonding (direct bonding). The sacrificial wafer is later ground, lapped and/or polished to a relatively thin film on top of the oxide insulator layer. The thin single-crystal or poly-crystalline silicon is then doped with boron (or other dopants) using ion implantation or thermal diffusion to achieve the necessary sheet resistance. Photolithography and reactive ion etching (RIE) are used to pattern the single-crystal or poly-crystalline silicon film to form the sensing elements 502. Patterned metal film (not shown) connects the sensing elements 502 to form a Wheatstone bridge. The temperature expansion of the sensing element 502 is thus well matched with the silicon diaphragm 506 so that there are no significant thermally induced stresses.

The micromachined gauge wafer 518 is bonded to a spacer wafer 520 using fusion bonding, anodic bonding, eutectic bonding, solder preform bonding, glass frit bonding or an alternative bonding technique. The bonding should be able to survive high-temperature operation or any subsequent processing or packaging steps that occur after bonding. As shown in FIG. 5, the bonding surface includes bottom surface 510 of the pedestal 508 of the micromachined gauge wafer 518 and the top surface 512 of the spacer 520. Typically, anodic bonding is used for a pyrex spacer wafer, and fusion bonding, glass frit bonding, eutectic bonding, or thermo-compression bonding is used for a silicon spacer wafer. Other types of spacer materials and bonding techniques can be employed without diverting from the scope of the disclosure. The spacer wafer provides stress relief when the gauge wafer is mounted in a housing or a package that may have a different coefficient of thermal expansion from the gauge wafer.

Figure 6:
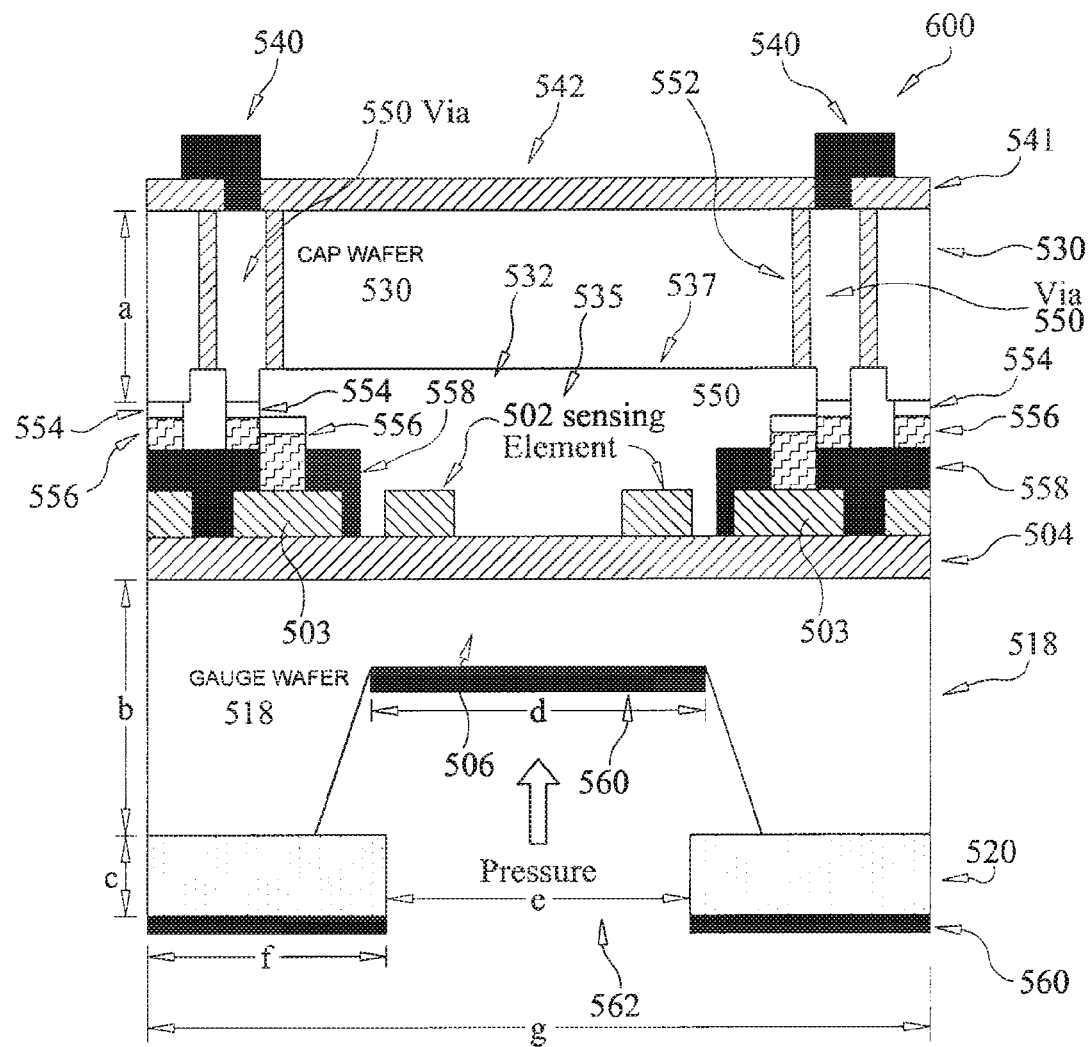
FIG. 6 shows one aspect that utilizes through-wafer vertical vias to bring out electrical connections from the sensing elements.

FIG. 6 shows a first sensor 600 of the present disclosure. The absolute pressure sensor 600 shown in FIG. 6 is similar to the pressure sensor 500 shown in FIG. 5, but shows additional structural components not shown in FIG. 5.

Pressure sensor 600 comprises three main structural components: gauge wafer 518, cap wafer 530, and spacer wafer 520. Example dimensions for the thickness of the gauge wafer b=0.4 mm, thickness of the spacer wafer c=0.5 mm, thickness of the cap wafer a=0.5 mm. Other dimensions, i.e. width of the gauge wafer g, inner and outer diameters of the spacer wafer (e and (e+2f) respectively), width of the diaphragm region d etc. are also typically in the millimeter range. An example thickness of the thinned down silicon diaphragm is 27 microns. Other dimensions are possible depending on the materials and configurations.

Figure 8:
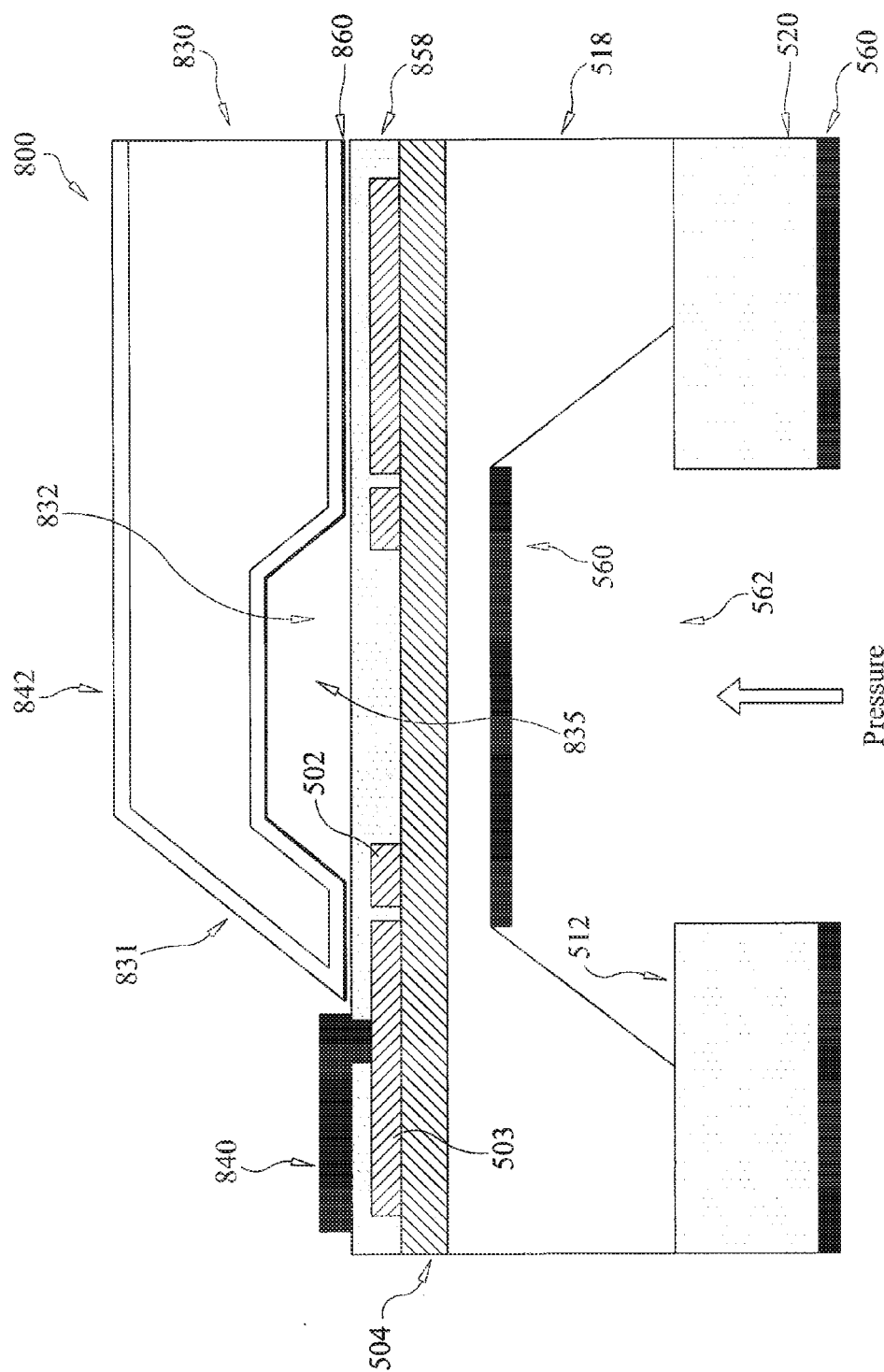
FIG. 8 shows one aspect that utilizes peripheral bond pads to bring out electrical connections from the sensing elements.

Gauge wafer 518 may include silicon interconnectors 503, planarization/passivation layer 558, barrier metal layer 556 and bonding metal layer 554. Interconnectors 503 are typically made of the same material as the sensing elements 502. Typical composition and thickness of layer 554 is 1 um gold. Barrier metal layer 556 may be 2000 A Ti/Pt or Ti/W. In the aspect shown in FIG. 6, eutectic gold bonding is used to couple cap wafer 530 with gauge wafer 518. Other bonding techniques may be used and other interfacial layers may be employed according to the bonding technique. Planarization/passivation layer 558 may be 500 Å silicon dioxide and 2000 Å silicon nitride. As shown in FIG. 6, windows are opened in the planarization/passivation layer 558 to make contact with on-wafer silicon interconnects 503. Sensing elements 502 may be exposed as shown in FIG. 6, or covered by planarization/passivation layer 858 (similar to layer 558), as shown in FIG. 8.

An external metal layer 560 can be deposited at the bottom of diaphragm 506. For example, a Ti/Pt/Au 500 Å/1000 Å/1500 Å metal layer can be deposited if spacer wafer 520 is blanket coated for bonding to a housing/package (not shown) that houses the pressure sensor 600. The housing may be made of Kovar or other materials, compatible to the pressurized medium.

Cap wafer 530, when bonded to gauge wafer 518, creates reference cavity 535. Cap wafer 530 has a bottom surface 537 that includes a recess 532. The position and dimension of the recess 532 is such that it encloses sensing elements 502. Cap wafer 530 includes embedded vias 550 that are electrically conductive. Vias 550 may have insulating sidewalls 552 if the cap wafer is made of an electrically conducting material. As will be described with respect to FIG. 7A, in one aspect, vias may be defined as portions of the conductive cap wafer surrounded by insulating sidewalls. In other aspects, the cap wafer may be an electrically insulating material, and vias are conductive pathways through the cap wafer. Electrical connections to sensing elements 502 are brought out through the vias 550 to the outer surface 541 of the cap wafer 530. Outer surface of cap wafer 541 has an insulator layer 542 with windows defined in it to pattern metal pads 540. Metal pads 540 may be made of 1 um thick Al/Si/Cu or other interconnect or bonding metallization.

In the example shown in FIG. 6, material of the cap wafer is silicon. Insulating sidewall 552 of each via 550 ensures that the vias are not shorted through the bulk silicon body of cap 530. When through-wafer silicon vias are used to bring out electrical connectivity from the vacuum cavity, cap wafer 530 uses silicon material with relatively low bulk resistivity. Other type of conductive materials can be used too for the cap wafer.

Spacer wafer 520 has a central hole 562 to give access to the pressurized medium to the diaphragm. Hole 562 may be of any geometric shape, including circular, square, rectangular, polygonal etc.

Figure 7A:
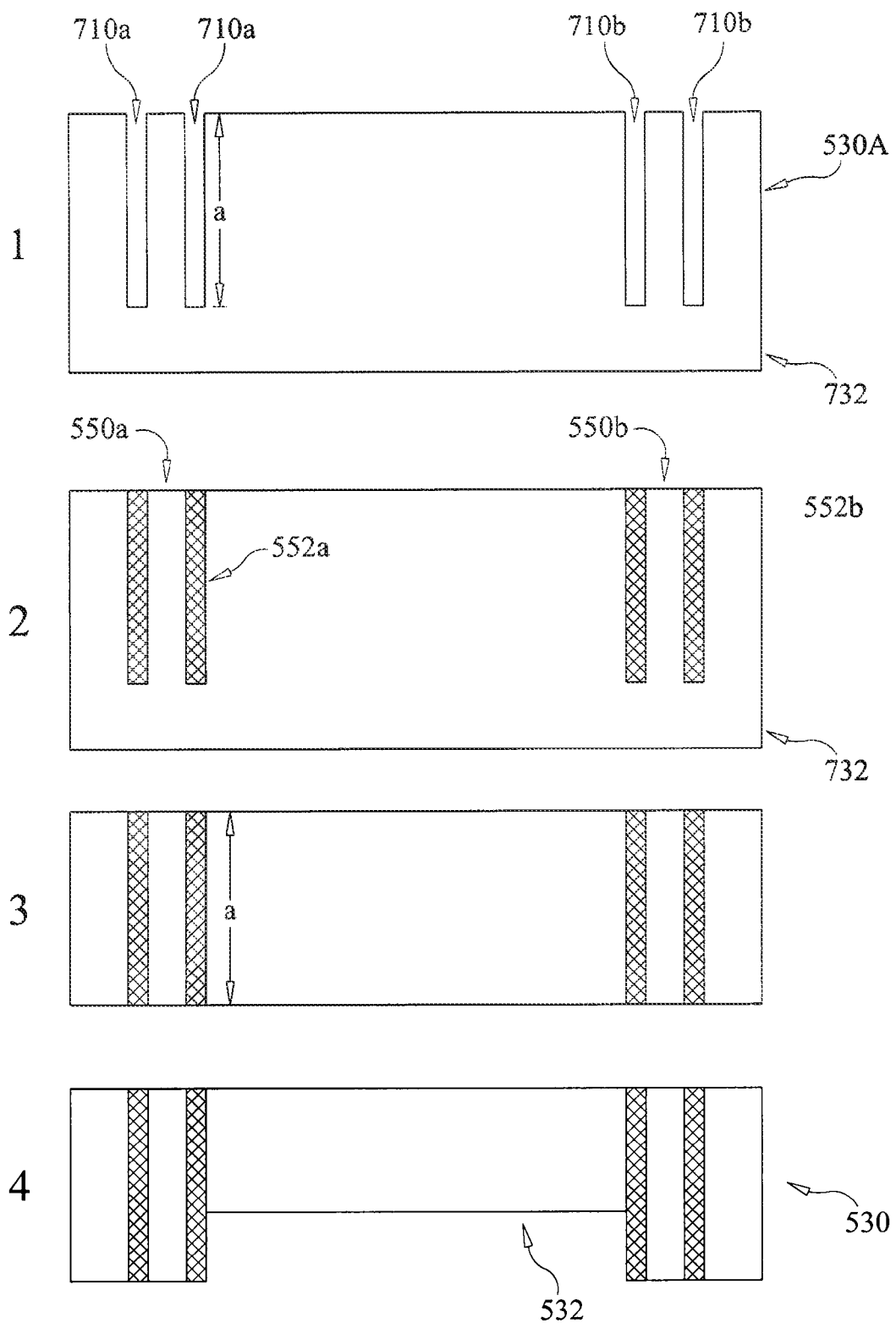
FIGS. 7A-7E show various processing steps used in one aspect to manufacture the pressure sensor shown in FIG. 6.

FIG. 7A shows an example method of making a cap wafer 530. In FIG. 7A, in step 1, a silicon wafer 530A is dry etched to define deep trenches 710a-b. Trench 710a is a continuous trench encircling via 550a, and trench 710b is a continuous trench encircling via 550b. In step 2, trenches 710a-b are filled with electrical insulator, such as silicon dioxide to create insulating sidewalls 552a-b. In step 3, lower portion 732 of the wafer 530A is polished or etched off to complete the through-wafer vias. In step 4, the central recess 532 is defined by another etching step.

Figure 7B:
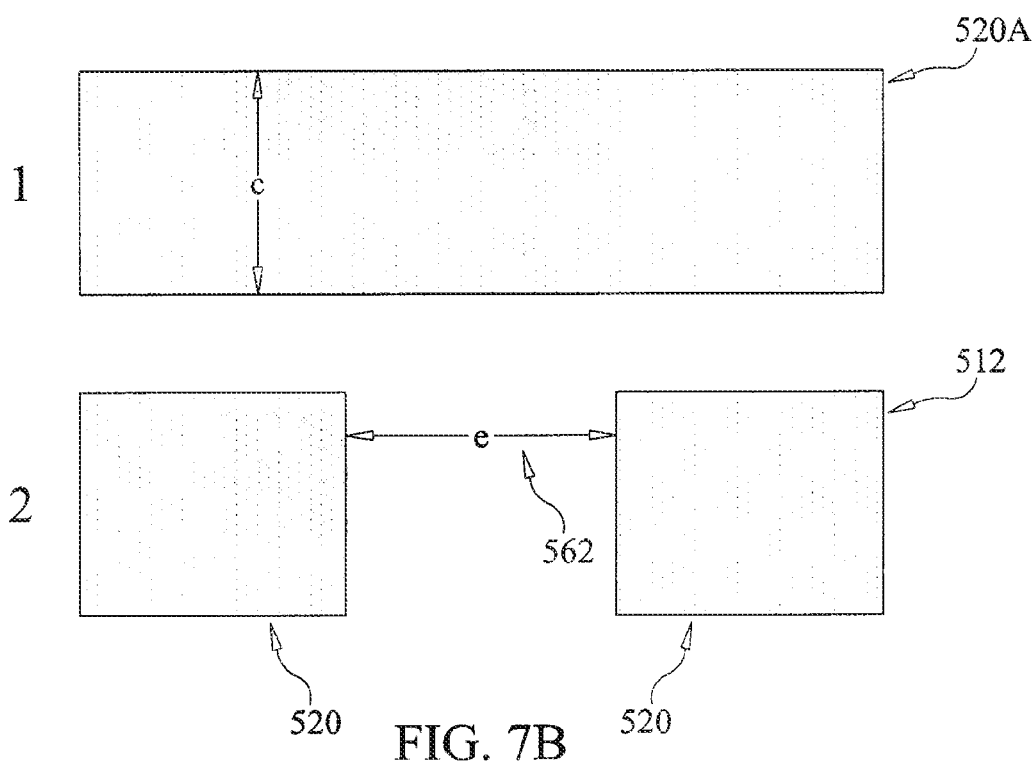

FIG. 7B shows an example method of forming spacer wafer 520. In step 1, a silicon/pyrex or other material wafer 520A is polished to a desired thickness c. In step 2, a hole 562 is made at the center. The hole can be made by drilling or through-wafer etching. Upper surface 512 may be further processed for bonding with the gauge wafer 518. Note that spacer wafer 520A may be polished after being bonded to the gauge wafer 518.

Figure 7C:
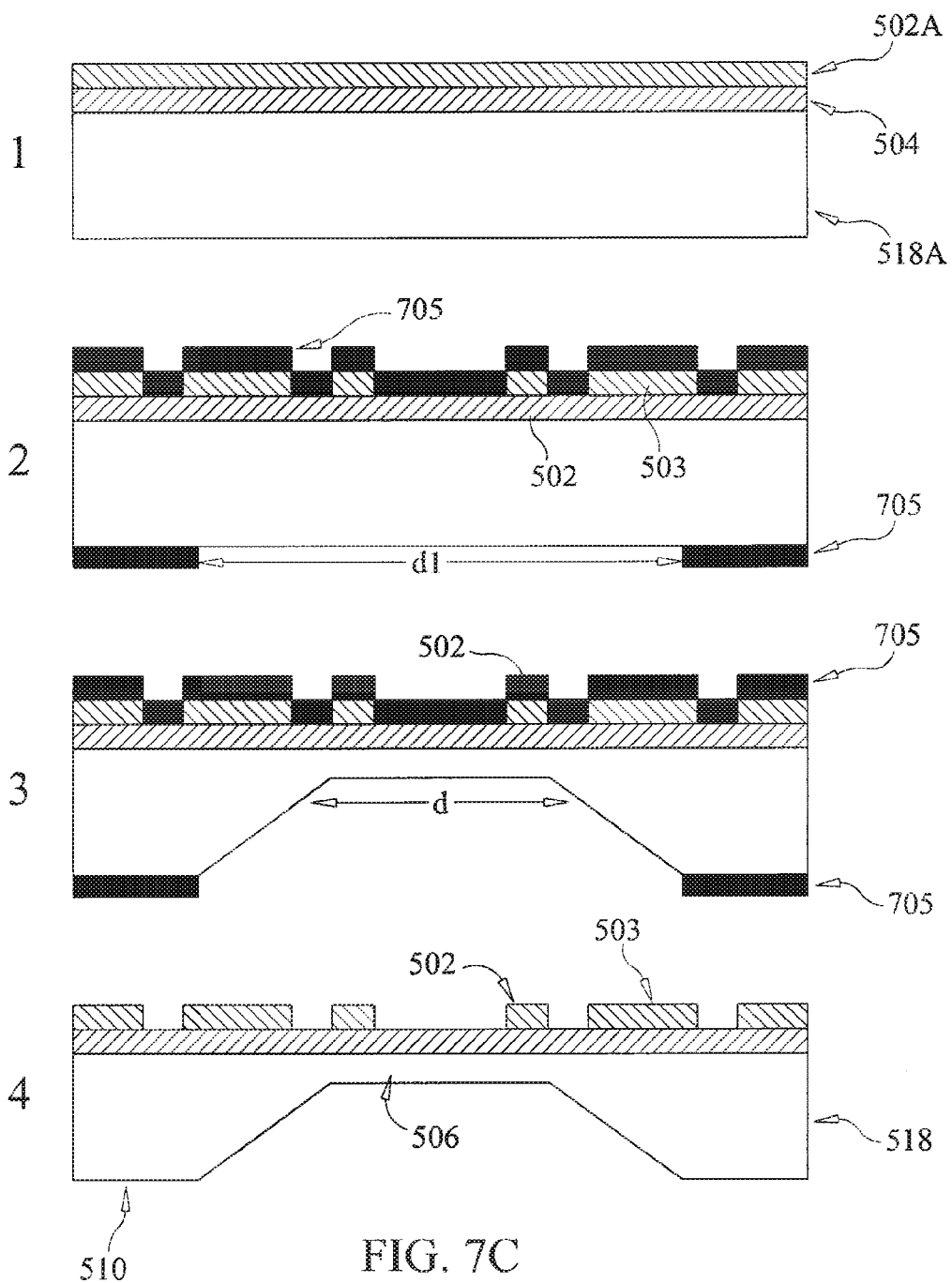

FIG. 7C shows example steps of making gauge wafer 518. Gauge wafer 518 processing may begin with a silicon-on-insulator wafer 518A, having a silicon layer 502A on top of an silicon dioxide layer 504. Alternatively, in step 1, layer 502A may be formed on top of an oxide-coated silicon wafer, as described with respect to FIG. 5. In step 2, the layer 502A is patterned to define sensing elements 502 and interconnects 503. A passivation layer 705 is deposited to protect the sensing elements on top, and an window of width d1 is opened in the bottom in preparation for wet etching. Passivation layer may have silicon nitride, and acts as a wet etch mask. Width d1 is determined by the desired final width d of the diaphragm region. In the wet etch step 3, KOH solution is used for anisotropic etching of silicon. Time of the wet etch process is controlled precisely to obtain the desired thickness (for example 27 um) of the diaphragm. Note that dry etching can be used too to define the diaphragm (as shown in FIG. 7F). In step 4, the passivation layer is stripped off.

Figure 7D:
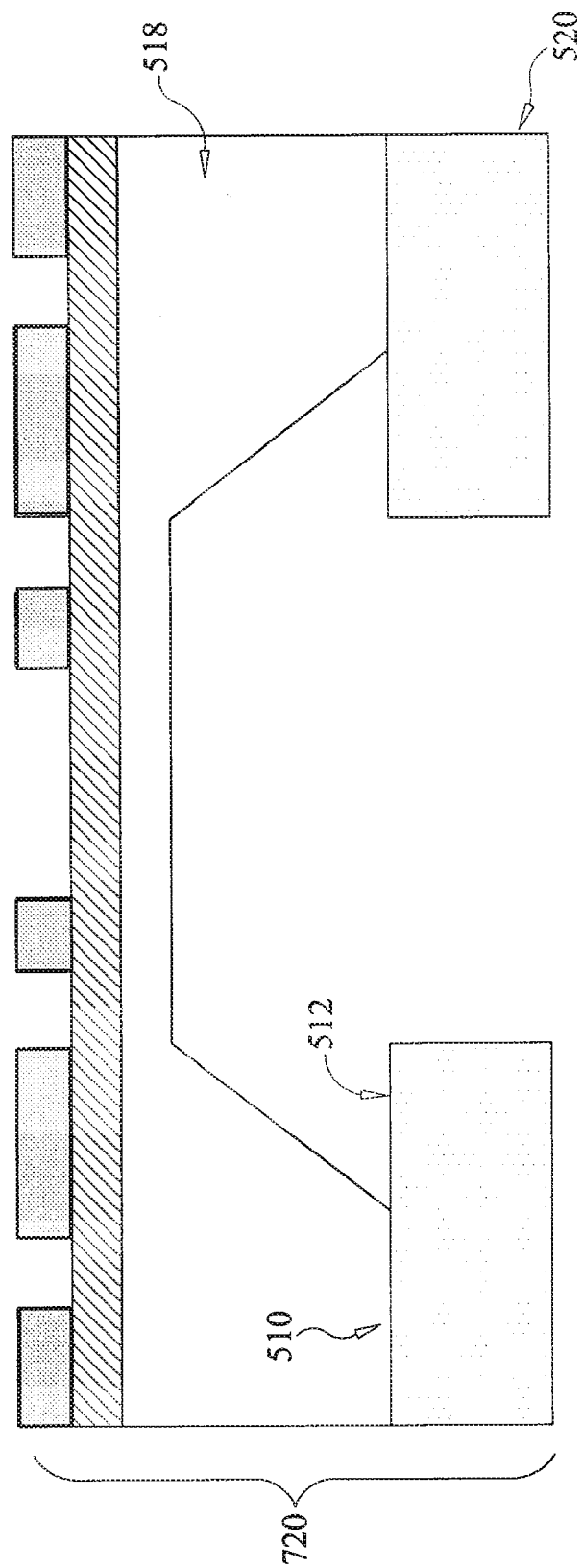

FIG. 7D shows a combination 720 with the gauge wafer 518 and the spacer wafer 520 bonded to each other. As discussed before, various bonding techniques, such as anodic bonding, fusion bonding, glass frit bonding, eutectic bonding, solder preform bonding, or thermo-compressive bonding may be used, and an interfacial surface preparation for the gauge wafer and the spacer wafer is done accordingly.

Figure 7E:
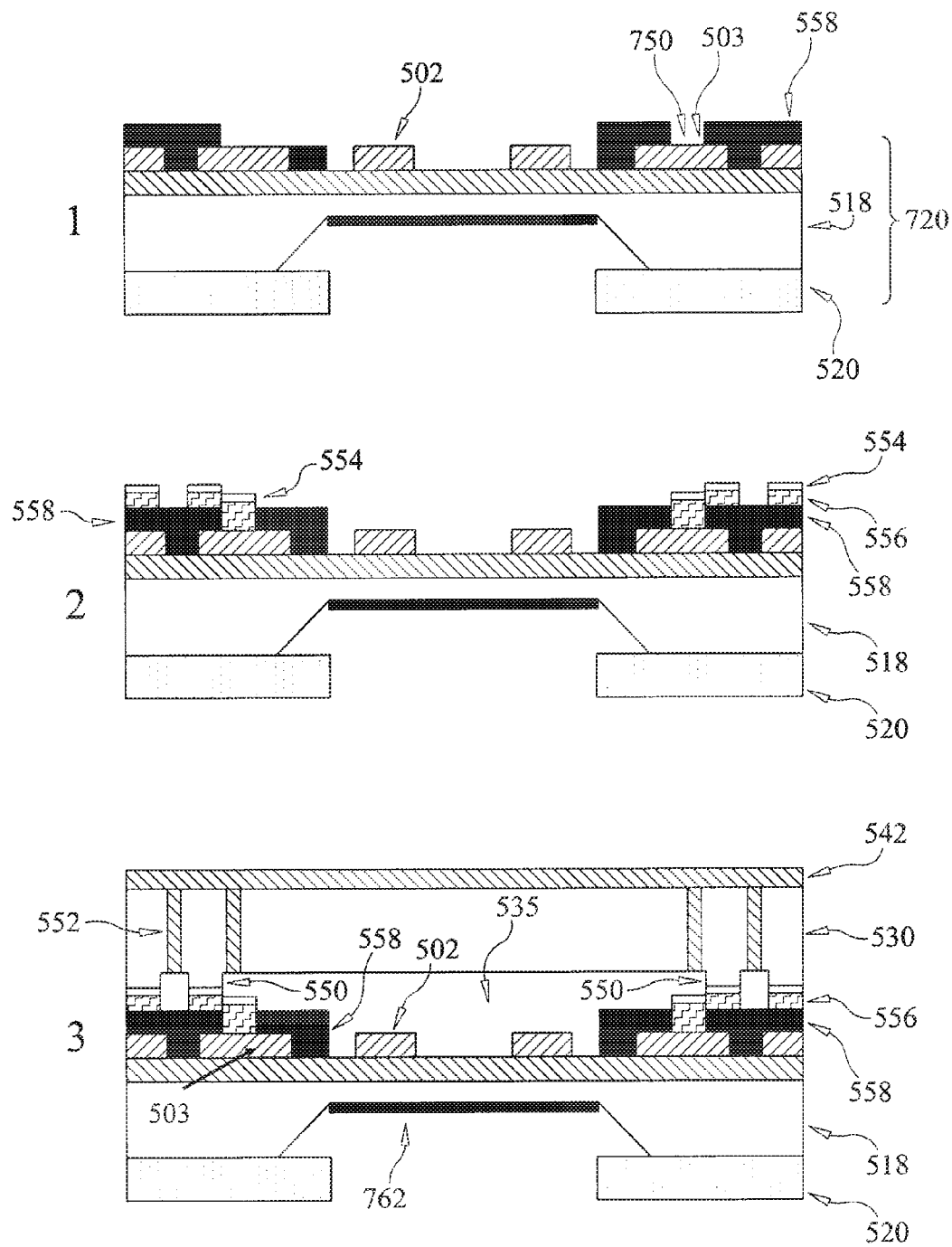
Figure 7F:
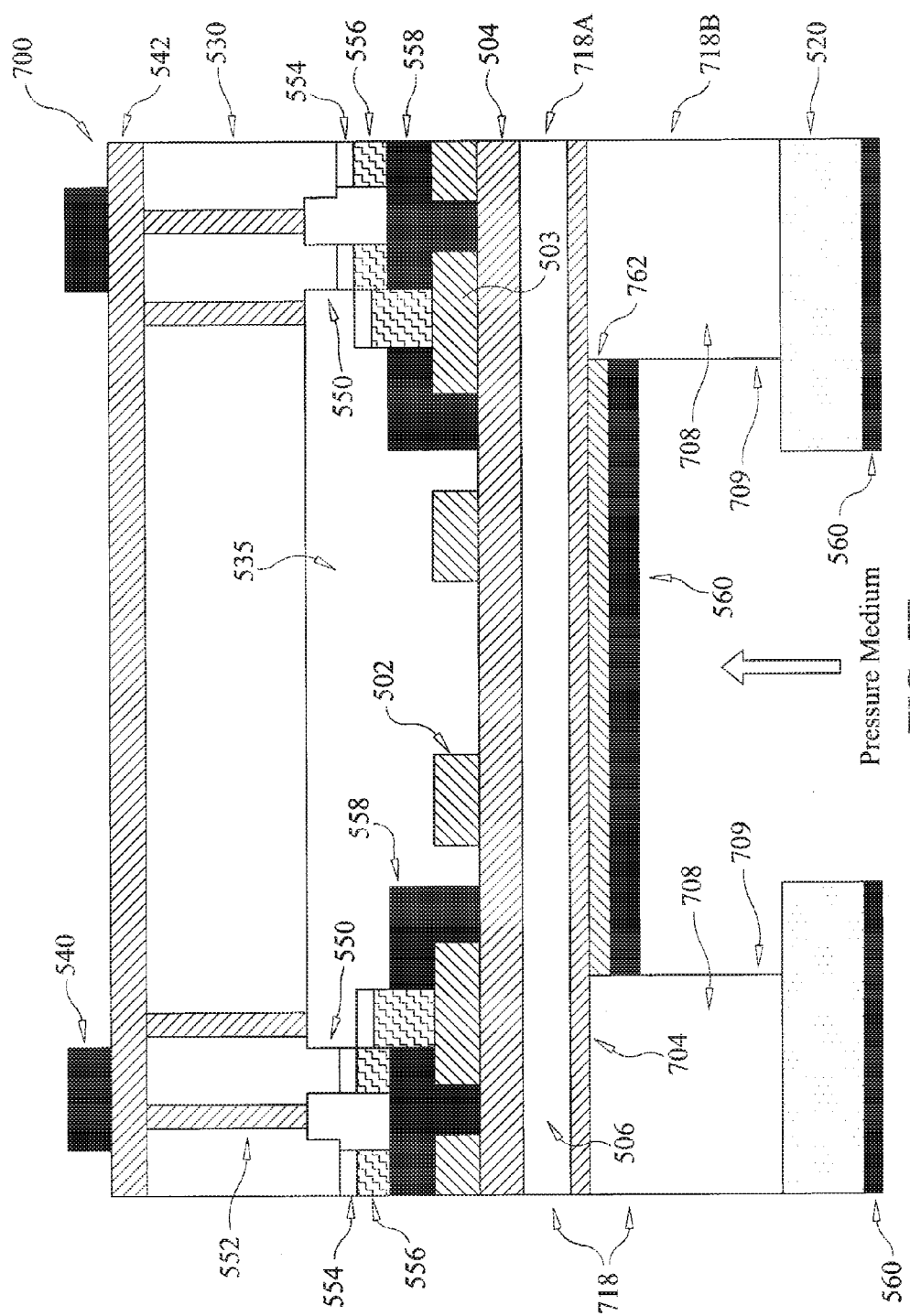
FIG. 7F shows one aspect that utilizes through-wafer vertical vias to bring out electrical connections from the sensing elements, similar to the pressure sensor shown in FIG. 6, and uses a double silicon-on-insulator wafer as a gauge wafer.

FIG. 7E shows how the gauge-spacer combination 720 is bonded to the cap wafer 530. In step 1, a planarization/passivation layer 558 is formed, and windows 750 are opened on interconnections 503 to bring out electrical connection from sensing elements 502. In step 2, barrier metal 556 and bonding metal layer 554 are formed. Typical composition and thickness of layer 554 is 1 um gold. Barrier metal layer 556 may be 2000 A Ti/Pt or Ti/W. These steps are for eutectic bonding. Different interface preparation may be needed for other forms of bonding, such as solder preform bonding, fusion bonding, flip-chip bonding, thermo-compression bonding etc. It has to be noted that the bonding process should be reliable enough to create and sustain a vacuum reference cavity 535. In step 3, processed cap wafer 530 is bonded to the gauge wafer 518.

Variations of the structure and the process steps are possible within the scope of the disclosure. For example, in step 3 of FIG. 7E, a layer 762 of corrosion-resistant material, such as aluminum oxide, can be deposited on the diaphragm backside. Layer 762 will protect the diaphragm backside 506 in a very corrosive pressurized medium. The deposition of the corrosion-resistant material layer 762 has to be done before putting down metal layer 560 (shown in FIG. 6). Aluminum oxide may be deposited with a Liquid Phase deposition process or other types of deposition processes.

Although not shown in FIG. 7E, adding metallization 540 on top of insulation layer 542 and adding metal layer 560 creates the structure similar to pressure sensor 600 shown in FIG. 6.

In the above process, only one set of example steps are shown and described. Intermediate steps may be added or deleted, as required. The sequence of the processing steps is not limiting to the scope of the disclosure. For example, persons skilled in the art will appreciate that the gauge wafer 518 and the cap wafer 530 may be bonded first, and then the cap-gauge combination may be bonded to the spacer wafer 520. In that case, cap wafer and gauge wafer may be bonded using a higher temperature bonding process (for example, eutectic bonding), that remains intact while the gauge and the spacer wafers are bonded using a relatively lower temperature bonding process (for example, solder preform bonding). However, the lower temperature bonding process should still be able to sustain the operational temperature of the pressurized media. Also, wet etching of the gauge wafer (to define the diaphragm) may be done after the cap wafer is bonded to the gauge wafer.

FIG. 7F shows another pressure sensor 700 that is similar to the sensor 600 shown in FIG. 6 with the exception of how the gauge wafer is micromachined to define the diaphragm 506. In this example aspect, a double silicon-on-insulator (SOI) wafer 718 is chosen as the gauge wafer. A top silicon layer 718A of wafer 718 is sandwiched between two layers of oxide 504 and 704. Thickness of the layer 718A is determined by the desired thickness of the diaphragm. The lower silicon layer 718B of wafer 718 is dry etched to create the opening through which the pressurized medium reaches the bottom side of the diaphragm 506. Deep Reactive Ion Etching (DRIE) can be used to etch through the layer 718B with the oxide layer 704 acting as an etch stop layer. Corrosion-resistant layer 762 may or may not be used depending on the application.

FIG. 8 shows another example of a pressure sensor 800, in which instead of vertical vias, peripheral bond pads 840 are used to get electrical signals out from sensing elements 502. The cap wafer 830 in FIG. 8 does not need to be made of a conductive material, such as silicon, as no electrical connection is done using the cap 830. However, from a batch processing perspective, it may be advantageous to use a silicon wafer for the cap. Cap wafer 830 has a recess 832 in its bottom surface. Cap wafer 830 has a sidewall 831 which may or may not be slanted or sloped. When cap wafer 830 is bonded with gauge wafer 518, a sealed reference cavity 835 is created. Cap wafer may have a bonding layer 860 that is mated with a planarization layer 858 on top of the gauge wafer.

Like pressure sensor 600 and 700, pressure sensor 800 also does not employ any p-n junction, and is suitable for high-temperature applications. Additionally, as sensing elements 502 are away from direct contact with the pressurized medium, this configuration is compatible with harsh pressurized media, similar to pressure sensor 600 and 700.

Figure 9A:
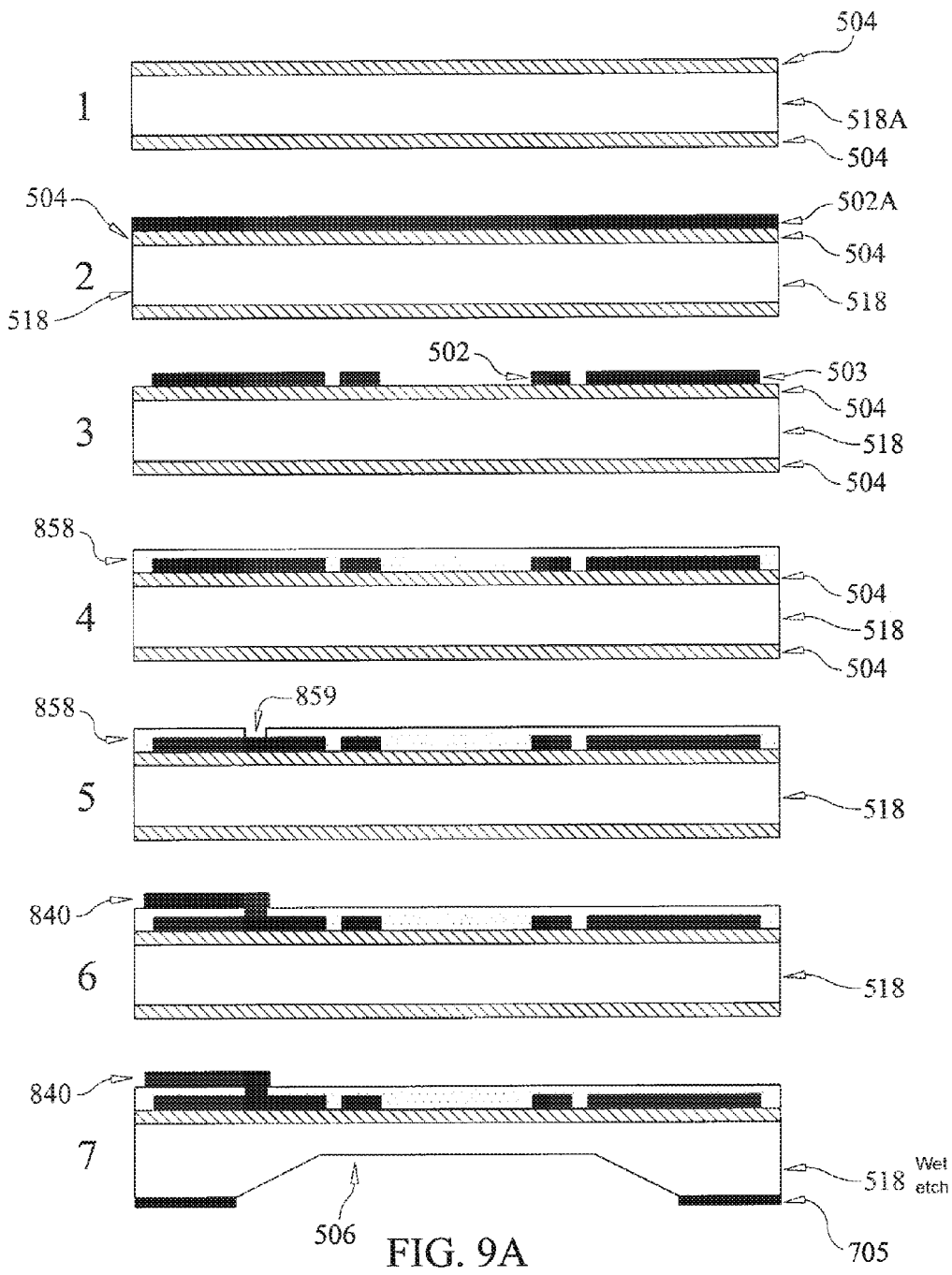
FIGS. 9A-9D show various processing steps used in one aspect to manufacture the pressure sensor shown in FIG. 8.

FIG. 9A shows example processing steps for making a gauge wafer 518 shown in pressure sensor 800. In step 1, oxide layers 504 are formed on a silicon wafer 518A. In step 2, sensing element layer 502A is formed, and doped with a dopant to obtain desired sheet resistance. In step 3, sensing elements 502 and interconnects 503 are patterned photolithographically. In step 4, a planarization layer 858 (such as PSG) is formed to encapsulate the sensing elements 502 and interconnects 503. The layer 858 is planarized. In step 5, windows 859 are opened in the planarization layer 858 to access interconnects 503. In step 6, peripheral bond pads 840 are created making contact with interconnects 503, so that electrical connection from sensing elements 502 can be brought out from the vacuum cavity. In step 7, the diaphragm 506 is defined by wet KOH etch. Dry etching can be used too to define the diaphragm. Nitride mask 705 may be used as a mask for the wet etch process. Though not shown in step 7, a nitride mask may protect metal pad 840 during wet etch.

Figure 9B:
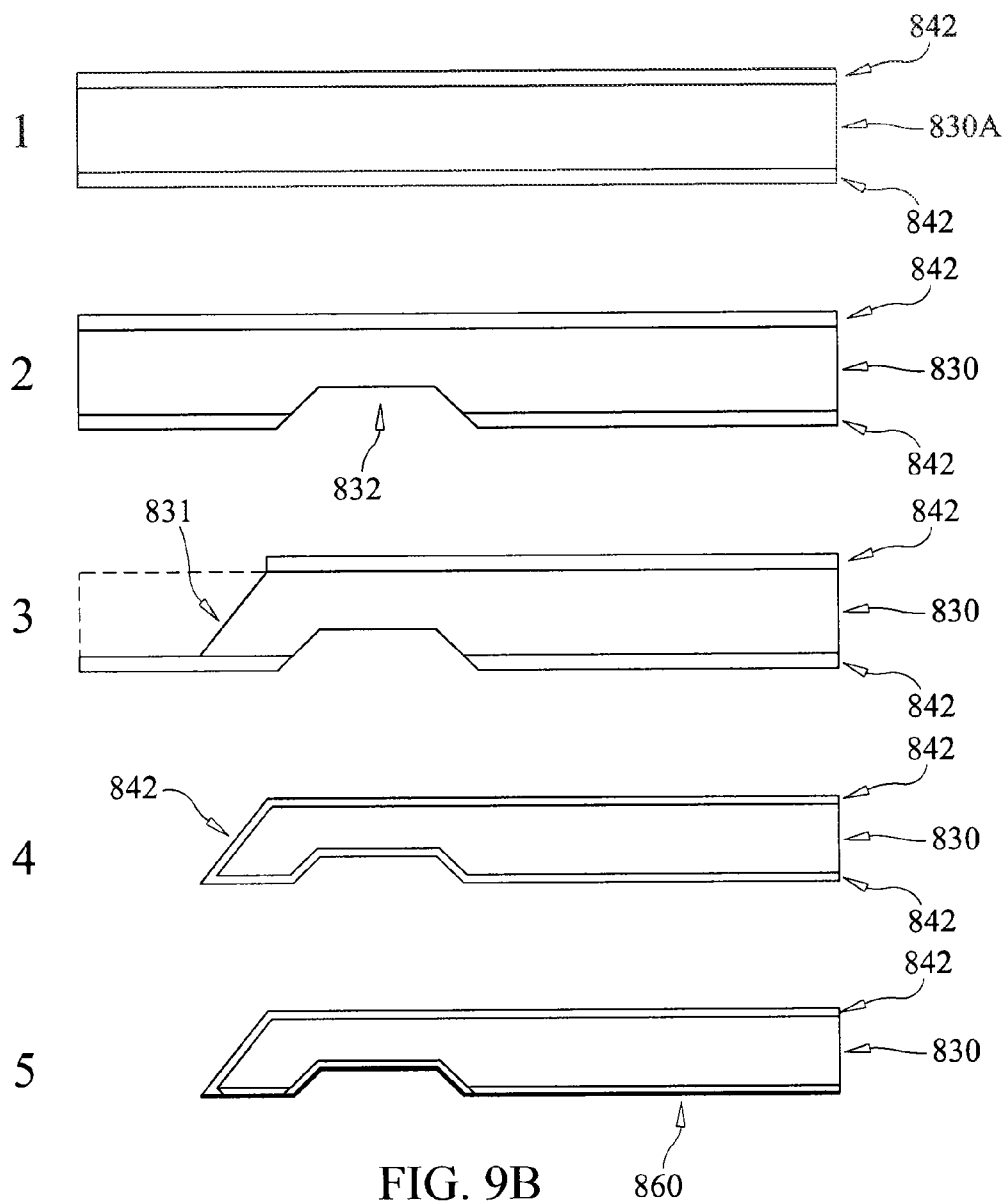

FIG. 9B shows example processing steps for making the cap wafer 830. In step 1, oxide layers 842 are formed on a silicon wafer 830A. In step 2, recess 832 is defined by dry or wet etch. In step 3, part of the wafer 830A is removed by etching through. This process may create a sloped sidewall 831. In step 4, wafer 830A is re-oxidized. In step 5, a glass frit layer 860 is deposited if glass frit bonding is adopted. For other bonding techniques, other type of interface preparation may be needed.

Figure 9C:
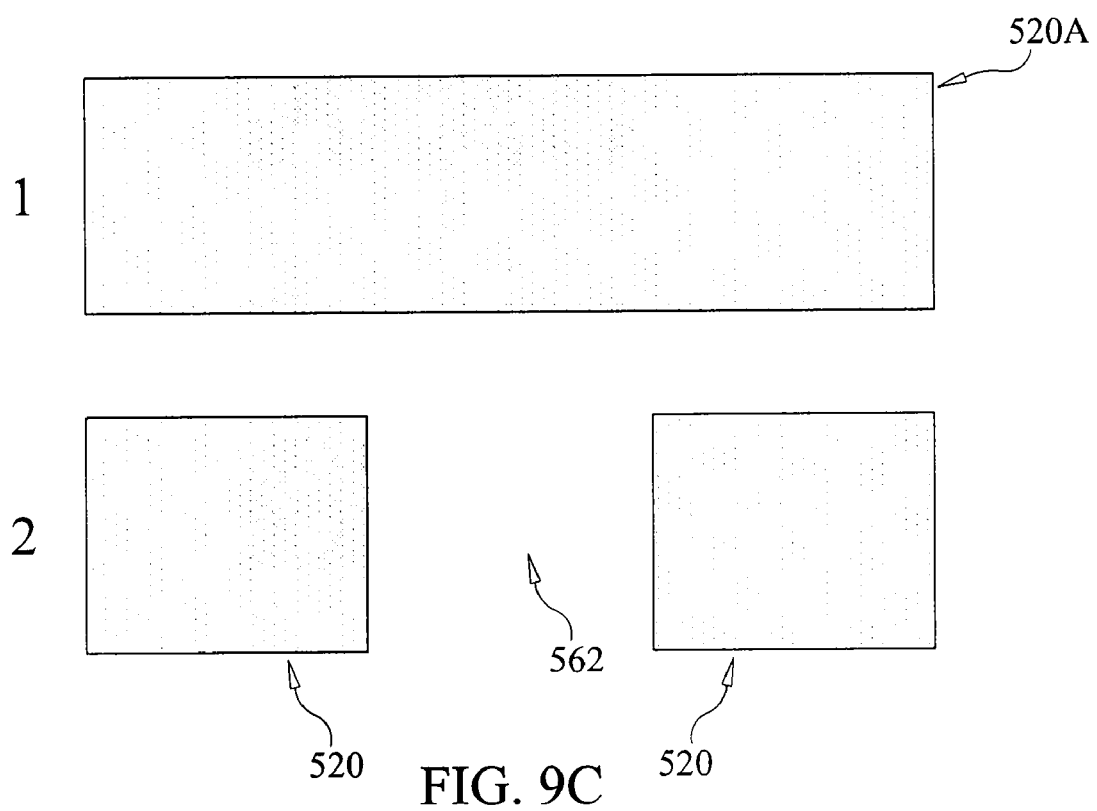

FIG. 9C shows the steps for preparing spacer wafer 520. The steps are identical to the steps shown in FIG. 7B.

Figure 9D:
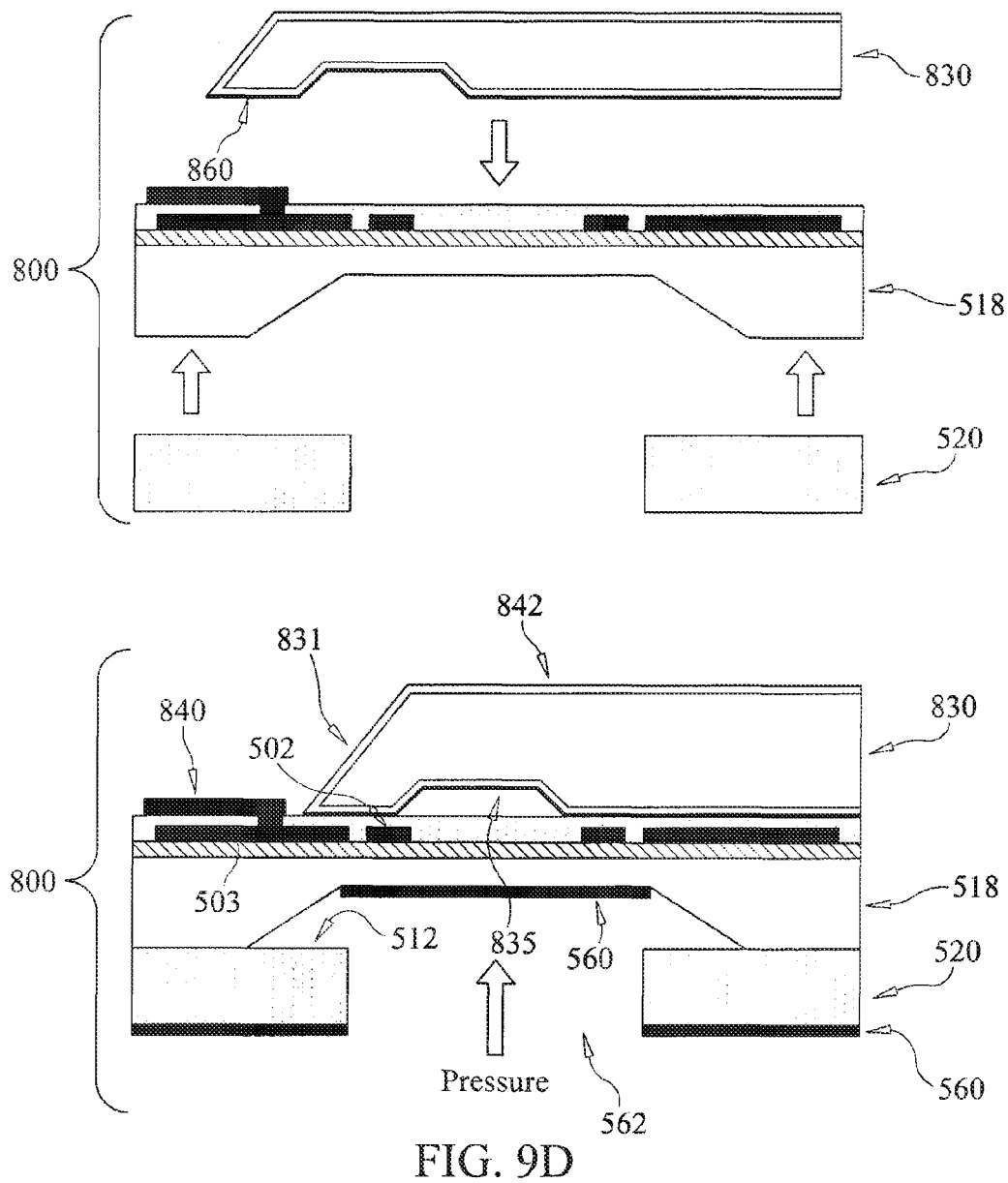

FIG. 9D schematically shows how the cap wafer 830, the gauge wafer 518, and the spacer wafer 520 are assembled to create the pressure sensor 800.

As described before, the sequence of bonding does not limit the scope of the disclosure, but the process steps need to be designed to support the bonding techniques and sequences.

Persons of ordinary skill in the art will now appreciate that a double SOI gauge wafer (as shown in FIG. 7F) can be used in sensor 800 as well for defining the diaphragm 506. Moreover, a corrosion-resistant layer 762 (as shown in FIG. 7E-7F) may be used on the bottom surface of the diaphragm 506.

Aspects of the present disclosure may be used in automotive applications, such as in an intake manifold, in transmission lines, in exhaust pipes, in or near tires, in or near engines, and the like. It can also be applied in biomedical instrumentations, aerospace, defense and other fields as will now be apparent to those of ordinary skill in the art.

The environments for automotive electronic products differs depending on location within the vehicle. In general, these environments are harsher than the consumer electronic products that are used in more benign home or office environments. The harshness stems from higher temperature, high humidity, vibration, and the like. FIG. 10 shows typical high temperatures encountered at different locations under the hood of an automobile [Reference: The National Electronics Manufacturing Initiative (NEMI) Roadmap, December 2000]

Table-1 in FIG. 11 shows the temperature extremes that would be encountered by the automotive pressure sensor depending on its location in the automobile. The temperatures shown are the temperatures of the sensor packaging surface. The internal temperature of the sensor electronic components is usually 10 to 15 degrees Celsius higher than the base plate temperature. Nowadays, more and more electronic accessories are being added to automobiles in each model year. When under-the-hood-temperatures became an issue and reliability was of major concern, many auto companies changed from 0 to 25° C. specifications to −40 to +125° C. Now, many electronic components, including automotive pressure sensors, have to pass extremely long operating tests at 140° C. or higher. Aspects of the present disclosure are developed with the higher temperature and corrosive pressurized medium (exhaust gas, transmission fluid, and the like) in mind.

While aspects and applications have been shown and described, it would be apparent to those skilled in the art having the benefit of this disclosure that many more modifications than mentioned above are possible without departing from the inventive concepts disclosed herein. The disclosure, therefore, is not to be restricted except in the spirit of the appended claims.

What is claimed is:

1. A method for manufacturing a Micro-Electro-Mechanical System (MEMS) pressure sensor, the method comprising:

forming a gauge wafer comprising a diaphragm region and a pedestal region, wherein a first surface of the diaphragm region is configured to be accessed by a pressurized medium that exerts a pressure resulting in a deflection of the diaphragm region;

forming an electrical insulation layer disposed on a second surface of the diaphragm region opposite to the first surface;

forming a plurality of sensing elements patterned on the electrical insulation layer disposed on the second surface in the diaphragm region, wherein a thermal expansion coefficient of the material of the sensing elements substantially matches with a thermal expansion coefficient of the material of the gauge wafer;

forming a cap wafer with a central recess in an inner surface;

forming a plurality of through-wafer embedded vias made of an electrically conductive material in the cap wafer;

creating a sealed cavity by coupling the inner recessed surface of the cap wafer to the gauge wafer, such that the sensing elements are enclosed in the recess, and electrical connections from the sensing elements come out to an outer surface of the cap wafer opposite to the inner recessed surface through the electrically conductive through-wafer embedded vias;

forming a spacer wafer with a central aperture; and attaching the spacer wafer to the pedestal region of the gauge wafer with the central aperture aligned to the diaphragm region;

wherein a layer containing the sensing elements is made of silicon doped to achieve a desired sheet resistance.

2. The method of claim 1, wherein the step of forming the plurality of through-wafer via comprises:

selecting a cap wafer material that is electrically conductive;

making trenches surrounding portions of the cap wafer defined to be via regions; and filling up the trenches with an electrically insulating material.

3. The method of claim 1, wherein the layer containing the sensing elements is a polycrystalline silicon layer, a single-crystalline silicon layer, or a layer formed by fusion bonding a sacrificial wafer on top of the electrical insulation layer followed by removing a substantial portion of the sacrificial wafer.

4. The method of claim 1, wherein the spacer wafer is made of Pyrex or silicon.

5. The method of claim 1, wherein the step of attaching the spacer wafer comprises using one or more of the following processes: anodic bonding, fusion bonding, glass frit bonding, eutectic bonding, solder preform bonding, and thermo-compressive bonding.

6. The method of claim 1, wherein the cap wafer is coupled to the gauge wafer using glass frit bonding, eutectic bonding, fusion bonding, solder preform bonding, flip-chip bonding, or thermo-compressive bonding.

7. The method of claim 1, wherein the method further comprises depositing a layer of corrosion resistant material on the first surface of the diaphragm region accessed by the pressurized medium.

8. The method of claim 7, wherein the corrosion resistant material is aluminum oxide.

9. The method of claim 1, further comprising planarizing portions of an outer surface of the gauge wafer to be mated with the cap wafer.

10. A method for manufacturing a Micro-Electro-Mechanical System (MEMS) pressure sensor, the method comprising:

forming a gauge wafer comprising a diaphragm region and a pedestal region, wherein a first surface of the diaphragm region is configured to be accessed by a pressurized medium that exerts a pressure resulting in a deflection of the diaphragm region;

forming an electrical insulation layer disposed on a second surface of the diaphragm region opposite to the first surface;

forming at least one sensing element on the electrical insulation layer, forming a plurality of through-wafer embedded vias made of an electrically conductive material in a cap wafer, wherein the cap wafer includes a central recess in an inner surface;

coupling the inner surface of the cap wafer to the gauge wafer to create a sealed cavity, wherein electrical connections from the sensing element come out to an outer surface of the cap wafer opposite to the inner recessed surface through the vias, wherein a layer containing the at least one sensing element is made of silicon doped to achieve a desired sheet resistance.

11. The method of claim 10, wherein a thermal expansion coefficient of the material of the sensing elements substantially matches with a thermal expansion coefficient of the material of the gauge wafer.

12. The method of claim 10, further comprising attaching a spacer wafer to the pedestal region of the gauge wafer, wherein the spacer wafer includes a central aperture aligned to the diaphragm region.

13. The method of claim 10, wherein the forming the plurality of through-wafer via comprises:

selecting a cap wafer material that is electrically conductive;

making trenches surrounding portions of the cap wafer defined to be via regions; and filling up the trenches with an electrically insulating material.

14. The method of claim 10, wherein the layer containing the at least one sensing element is a polycrystalline silicon layer, a single-crystalline silicon layer, or a layer formed by fusion bonding a sacrificial wafer on top of the electrical insulation layer followed by removing a substantial portion of the sacrificial wafer.

15. The method of claim 10, wherein the spacer wafer is made of Pyrex or silicon.

16. The method of claim 10, wherein the of attaching the spacer wafer comprises using one or more of the following processes: anodic bonding, fusion bonding, glass fit bonding, eutectic bonding, solder preform bonding, and thermo-compressive bonding.

17. The method of claim 10, wherein the cap wafer is coupled to the gauge wafer using glass frit bonding, eutectic bonding, fusion bonding, solder preform bonding, flip-chip bonding, or thermo-compressive bonding.

18. The method of claim 10, wherein the method further comprises depositing a layer of corrosion resistant material on the first surface of the diaphragm region accessed by the pressurized medium.

19. A method for manufacturing a Micro-Electro-Mechanical System (MEMS) pressure sensor, the method comprising:

forming a gauge wafer comprising a diaphragm region and a pedestal region, wherein a first surface of the diaphragm region is configured to be accessed by a pressurized medium that exerts a pressure resulting in a deflection of the diaphragm region;

forming an electrical insulation layer disposed on a second surface of the diaphragm region opposite to the first surface;

forming a plurality of sensing elements patterned on the electrical insulation layer disposed on the second surface in the diaphragm region, wherein a thermal expansion coefficient of the material of the sensing elements substantially matches with a thermal expansion coefficient of the material of the gauge wafer;

forming a cap wafer with a central recess in an inner surface;

forming a plurality of through-wafer embedded vias made of an electrically conductive material in the cap wafer;

creating a sealed cavity by coupling the inner recessed surface of the cap wafer to the gauge wafer, such that the sensing elements are enclosed in the recess, and electrical connections from the sensing elements come out to an outer surface of the cap wafer opposite to the inner recessed surface through the electrically conductive through-wafer embedded vias;

forming a spacer wafer with a central aperture; and
attaching the spacer wafer to the pedestal region of the gauge wafer with the central aperture aligned to the diaphragm region,
wherein the layer containing the sensing elements is a polycrystalline silicon layer, a single-crystalline silicon layer, or a layer formed by fusion bonding a sacrificial wafer on top of the electrical insulation layer followed by removing a substantial portion of the sacrificial wafer.

20. A method for manufacturing a Micro-Electro-Mechanical System (MEMS) pressure sensor, the method comprising:
forming a gauge wafer comprising a diaphragm region and a pedestal region, wherein a first surface of the diaphragm region is configured to be accessed by a pressurized medium that exerts a pressure resulting in a deflection of the diaphragm region;
forming an electrical insulation layer disposed on a second surface of the diaphragm region opposite to the first surface;
forming at least one sensing element on the electrical insulation layer,
forming a plurality of through-wafer embedded vias made of an electrically conductive material in a cap wafer, wherein the cap wafer includes a central recess in an inner surface;
coupling the inner surface of the cap wafer to the gauge wafer to create a sealed cavity, wherein electrical connections from the sensing element come out to an outer surface of the cap wafer opposite to the inner recessed surface through the vias,
wherein the layer containing the sensing elements is a polycrystalline silicon layer, a single-crystalline silicon layer, or a layer formed by fusion bonding a sacrificial wafer on top of the electrical insulation layer followed by removing a substantial portion of the sacrificial wafer.

21. A method for manufacturing a Micro-Electro-Mechanical System (MEMS) pressure sensor, the method comprising:
forming a gauge wafer comprising a diaphragm region and a pedestal region, wherein a first surface of the diaphragm region is configured to be accessed by a pressurized medium that exerts a pressure resulting in a deflection of the diaphragm region;
forming an electrical insulation layer disposed on a second surface of the diaphragm region opposite to the first surface;
forming a plurality of sensing elements patterned on the electrical insulation layer disposed on the second surface in the diaphragm region, wherein a thermal expansion coefficient of the material of the sensing elements substantially matches with a thermal expansion coefficient of the material of the gauge wafer;
forming a cap wafer with a central recess in an inner surface;
forming a plurality of through-wafer embedded vias made of an electrically conductive material in the cap wafer;
creating a sealed cavity by coupling the inner recessed surface of the cap wafer to the gauge wafer, such that the sensing elements are enclosed in the recess, and electrical connections from the sensing elements come out to an outer surface of the cap wafer opposite to the inner recessed surface through the electrically conductive through-wafer embedded vias;
forming a spacer wafer with a central aperture; and
attaching the spacer wafer to the pedestal region of the gauge wafer with the central aperture aligned to the diaphragm region,
wherein the spacer wafer is made of Pyrex or silicon.

22. A method for manufacturing a Micro-Electro-Mechanical System (MEMS) pressure sensor, the method comprising:
forming a gauge wafer comprising a diaphragm region and a pedestal region, wherein a first surface of the diaphragm region is configured to be accessed by a pressurized medium that exerts a pressure resulting in a deflection of the diaphragm region;
forming an electrical insulation layer disposed on a second surface of the diaphragm region opposite to the first surface;
forming a plurality of sensing elements patterned on the electrical insulation layer disposed on the second surface in the diaphragm region, wherein a thermal expansion coefficient of the material of the sensing elements substantially matches with a thermal expansion coefficient of the material of the gauge wafer;
forming a cap wafer with a central recess in an inner surface;
forming a plurality of through-wafer embedded vias made of an electrically conductive material in the cap wafer;
creating a sealed cavity by coupling the inner recessed surface of the cap wafer to the gauge wafer, such that the sensing elements are enclosed in the recess, and electrical connections from the sensing elements come out to an outer surface of the cap wafer opposite to the inner recessed surface through the electrically conductive through-wafer embedded vias;
forming a spacer wafer with a central aperture; and
attaching the spacer wafer to the pedestal region of the gauge wafer with the central aperture aligned to the diaphragm region,
wherein the cap wafer is coupled to the gauge wafer using glass frit bonding, eutectic bonding, fusion bonding, solder preform bonding, flip-chip bonding, or thermocompressive bonding.

23. A method for manufacturing a Micro-Electro-Mechanical System (MEMS) pressure sensor, the method comprising:
forming a gauge wafer comprising a diaphragm region and a pedestal region, wherein a first surface of the diaphragm region is configured to be accessed by a pressurized medium that exerts a pressure resulting in a deflection of the diaphragm region;
forming an electrical insulation layer disposed on a second surface of the diaphragm region opposite to the first surface;
forming a plurality of sensing elements patterned on the electrical insulation layer disposed on the second surface in the diaphragm region, wherein a thermal expansion coefficient of the material of the sensing elements substantially matches with a thermal expansion coefficient of the material of the gauge wafer;
forming a cap wafer with a central recess in an inner surface;
forming a plurality of through-wafer embedded vias made of an electrically conductive material in the cap wafer;
creating a sealed cavity by coupling the inner recessed surface of the cap wafer to the gauge wafer, such that the sensing elements are enclosed in the recess, and electrical connections from the sensing elements come out to an outer surface of the cap wafer opposite to the inner recessed surface through the electrically conductive through-wafer embedded vias;
forming a spacer wafer with a central aperture;
attaching the spacer wafer to the pedestal region of the gauge wafer with the central aperture aligned to the diaphragm region; and
depositing a layer of corrosion resistant material on the first surface of the diaphragm region accessed by the pressurized medium.

24. A method for manufacturing a Micro-Electro-Mechanical System (MEMS) pressure sensor, the method comprising:
forming a gauge wafer comprising a diaphragm region and a pedestal region, wherein a first surface of the diaphragm region is configured to be accessed by a pressurized medium that exerts a pressure resulting in a deflection of the diaphragm region;
forming an electrical insulation layer disposed on a second surface of the diaphragm region opposite to the first surface;
forming at least one sensing element on the electrical insulation layer;
forming a plurality of through-wafer embedded vias made of an electrically conductive material in a cap wafer, wherein the cap wafer includes a central recess in an inner surface; and
coupling the inner surface of the cap wafer to the gauge wafer to create a sealed cavity, wherein electrical connections from the sensing element come out to an outer surface of the cap wafer opposite to the inner recessed surface through the vias,
wherein the forming the plurality of through-wafer via comprises:
selecting a cap wafer material that is electrically conductive;
making trenches surrounding portions of the cap wafer defined to be via regions; and
filling up the trenches with an electrically insulating material.

25. A method for manufacturing a Micro-Electro-Mechanical System (MEMS) pressure sensor, the method comprising:
forming a gauge wafer comprising a diaphragm region and a pedestal region, wherein a first surface of the diaphragm region is configured to be accessed by a pressurized medium that exerts a pressure resulting in a deflection of the diaphragm region;
forming an electrical insulation layer disposed on a second surface of the diaphragm region opposite to the first surface;
forming at least one sensing element on the electrical insulation layer;
forming a plurality of through-wafer embedded vias made of an electrically conductive material in a cap wafer, wherein the cap wafer includes a central recess in an inner surface; and
coupling the inner surface of the cap wafer to the gauge wafer to create a sealed cavity, wherein electrical connections from the sensing element come out to an outer surface of the cap wafer opposite to the inner recessed surface through the vias,
wherein the spacer wafer is made of Pyrex or silicon.

26. A method for manufacturing a Micro-Electro-Mechanical System (MEMS) pressure sensor, the method comprising:
forming a gauge wafer comprising a diaphragm region and a pedestal region, wherein a first surface of the diaphragm region is configured to be accessed by a pressurized medium that exerts a pressure resulting in a deflection of the diaphragm region;
forming an electrical insulation layer disposed on a second surface of the diaphragm region opposite to the first surface;
forming at least one sensing element on the electrical insulation layer;
forming a plurality of through-wafer embedded vias made of an electrically conductive material in a cap wafer, wherein the cap wafer includes a central recess in an inner surface; and
coupling the inner surface of the cap wafer to the gauge wafer to create a sealed cavity, wherein electrical connections from the sensing element come out to an outer surface of the cap wafer opposite to the inner recessed surface through the vias,
wherein attaching the spacer wafer comprises using one or more of the following processes: anodic bonding, fusion bonding, glass frit bonding, eutectic bonding, solder preform bonding, and thermo-compressive bonding.

27. A method for manufacturing a Micro-Electro-Mechanical System (MEMS) pressure sensor, the method comprising:
forming a gauge wafer comprising a diaphragm region and a pedestal region, wherein a first surface of the diaphragm region is configured to be accessed by a pressurized medium that exerts a pressure resulting in a deflection of the diaphragm region;
forming an electrical insulation layer disposed on a second surface of the diaphragm region opposite to the first surface;
forming at least one sensing element on the electrical insulation layer;
forming a plurality of through-wafer embedded vias made of an electrically conductive material in a cap wafer, wherein the cap wafer includes a central recess in an inner surface; and
coupling the inner surface of the cap wafer to the gauge wafer to create a sealed cavity, wherein electrical connections from the sensing element come out to an outer surface of the cap wafer opposite to the inner recessed surface through the vias,
wherein the cap wafer is coupled to the gauge wafer using glass frit bonding, eutectic bonding, fusion bonding, solder preform bonding, flip-chip bonding, or thermo-compressive bonding.

28. A method for manufacturing a Micro-Electro-Mechanical System (MEMS) pressure sensor, the method comprising:
forming a gauge wafer comprising a diaphragm region and a pedestal region, wherein a first surface of the diaphragm region is configured to be accessed by a pressurized medium that exerts a pressure resulting in a deflection of the diaphragm region;
forming an electrical insulation layer disposed on a second surface of the diaphragm region opposite to the first surface;
forming at least one sensing element on the electrical insulation layer;
forming a plurality of through-wafer embedded vias made of an electrically conductive material in a cap wafer, wherein the cap wafer includes a central recess in an inner surface;

coupling the inner surface of the cap wafer to the gauge wafer to create a sealed cavity, wherein electrical connections from the sensing element come out to an outer surface of the cap wafer opposite to the inner recessed surface through the vias; and depositing a layer of corrosion resistant material on the first surface of the diaphragm region accessed by the pressurized medium.

\* \* \* \* \*